United States Patent
Lopez et al.

(10) Patent No.: US 10,320,524 B2
(45) Date of Patent: Jun. 11, 2019

(54) TRANSMITTING NODE, A RECEIVING NODE AND METHODS THEREIN FOR PROVIDING ENHANCED CHANNEL CODING

(71) Applicant: Telefonaktiebolaget LM Ericsson (publ), Stockholm (SE)

(72) Inventors: Miguel Lopez, Solna (SE); Dennis Sundman, Solna (SE); Leif Wilhelmsson, Dalby (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 226 days.

(21) Appl. No.: 15/109,827

(22) PCT Filed: May 25, 2016

(86) PCT No.: PCT/SE2016/050485
§ 371 (c)(1),
(2) Date: Jul. 6, 2016

(87) PCT Pub. No.: WO2017/204705
PCT Pub. Date: Nov. 30, 2017

(65) Prior Publication Data
US 2018/0198559 A1 Jul. 12, 2018

(51) Int. Cl.
*H04L 1/00* (2006.01)
*H04L 5/00* (2006.01)
(Continued)

(52) U.S. Cl.
CPC .......... *H04L 1/0064* (2013.01); *H03M 13/29* (2013.01); *H03M 13/2906* (2013.01);
(Continued)

(58) Field of Classification Search
CPC ............ H03M 1/36; H03M 7/00; H03M 7/34; H03M 13/00; H03M 13/29;
(Continued)

(56) References Cited

U.S. PATENT DOCUMENTS 9,009,573 B2 * 4/2015 Palanki ................ H04L 1/0065
714/774
2002/0167962 A1 * 11/2002 Kowalski ............. H04L 1/0057
370/445

(Continued)

FOREIGN PATENT DOCUMENTS

| EP | 2814181 A1 | 12/2014 |
| WO | 2014129951 A1 | 8/2014 |
| WO | 2015061729 A1 | 4/2015 |

OTHER PUBLICATIONS

Sanzi, Frieder et al., "Iterative Channel Estimation and Decoding with Product Codes in Multicarrier Systems", Vehicular Technology Conference, 2000. IEEE VTS FALL VTC 2000 52nd, Sep. 2000, 1338-1344.

(Continued)

*Primary Examiner* — Shawkat M Ali
(74) *Attorney, Agent, or Firm* — Murphy, Bilak & Homiller, PLLC

(57) ABSTRACT

A Transmitting Node (TN) 102 and a method therein for providing enhanced channel coding of a packet transmitted in a communications network 100. The TN applies, to payload data, an outer channel encoder resulting in a plurality of outer code bits. Further the TN applies an inner channel encoder to the plurality of outer code bits. Furthermore, the TN divides resulting code bits of the inner channel encoder into a first group and one or more second groups. Yet further, the TN generates a first set of OFDM symbols carrying at least a part of the first group, and second sets of OFDM symbols carrying at least a part of the one or more (Continued)

second groups. The TN transmits a packet comprising the first set of OFDM symbols followed by the second sets of OFDM symbols, whereby an enhanced channel coding of the transmitted packet is provided.

32 Claims, 9 Drawing Sheets

(51) Int. Cl.
*H03M 13/29* (2006.01)
*H03M 13/37* (2006.01)
*H03M 13/00* (2006.01)
*H04J 11/00* (2006.01)
*H04L 27/26* (2006.01)
*H04W 84/12* (2009.01)
*H03M 13/09* (2006.01)
*H03M 13/11* (2006.01)
*H03M 13/23* (2006.01)

(52) U.S. Cl.
CPC ..... *H03M 13/373* (2013.01); *H03M 13/3761* (2013.01); *H03M 13/6516* (2013.01); *H04L 1/0053* (2013.01); *H04L 1/0065* (2013.01); *H04L 1/0075* (2013.01); *H04L 5/0007* (2013.01); *H03M 13/09* (2013.01); *H03M 13/098* (2013.01); *H03M 13/1102* (2013.01); *H03M 13/23* (2013.01); *H04J 11/00* (2013.01); *H04L 1/0013* (2013.01); *H04L 1/0063* (2013.01); *H04L 27/2607* (2013.01); *H04L 27/2628* (2013.01); *H04W 84/12* (2013.01)

(58) Field of Classification Search
CPC ...... H03M 13/2942; H04J 11/00; H04K 1/10; H04L 1/00; H04L 1/0053; H04L 1/0064; H04L 1/0065; H04L 1/0075; H04L 5/00; H04L 7/0007; H04L 27/34

USPC ............ 341/51, 88; 370/252, 477; 375/260, 375/298; 714/755, 774, 776

See application file for complete search history.

(56) References Cited

U.S. PATENT DOCUMENTS

| | | | |
|---|---|---|---|
| 2007/0140292 A1* | 6/2007 | Sestok, IV | H03M 13/2789 370/465 |
| 2008/0063095 A1* | 3/2008 | Khayrallah | H04L 1/0009 375/260 |
| 2008/0298467 A1* | 12/2008 | Sallinen | H04N 21/23406 375/240.25 |
| 2009/0175210 A1* | 7/2009 | Vijayan | H04L 1/0065 370/312 |
| 2010/0253555 A1 | 10/2010 | Weingarten et al. | |
| 2011/0131464 A1* | 6/2011 | Ko | H04L 1/0041 714/752 |
| 2014/0126672 A1* | 5/2014 | Petrov | H03M 13/1165 375/298 |
| 2015/0092884 A1* | 4/2015 | Murakami | H04W 52/42 375/295 |
| 2017/0033962 A1* | 2/2017 | Kim | H04L 27/2602 |

OTHER PUBLICATIONS

Choo, Li-Chia et al., "CRC codes for short control frames in IEEE 802.11ah", 2014 IEEE 80th Vehicular Technology Conference (VTC2014—Fall), Vancouver, BC, Sep. 14-17, 2014, 1-5.

Langhammer, Nils et al., "PHY Modifications of IEEE 802.11 Systems for Transmission at Very Low SNR", 2011 8th International Workshop on Multi-Carrier Systems & Solutions (MC-SS), Herrsching, May 3-4, 2011, 1-4.

* cited by examiner

Figure 3 Method performed by transmitting node 102

Figure 6 Method performed by a receiving node 104

TRANSMITTING NODE, A RECEIVING NODE AND METHODS THEREIN FOR PROVIDING ENHANCED CHANNEL CODING

TECHNICAL FIELD

Embodiments herein relate generally to a transmitting node, a receiving node and to methods therein. In particular, embodiments herein relate to enhanced channel coding in a communications network.

BACKGROUND

Communication devices such as terminals are also known as e.g. User Equipments (UEs), mobile terminals, stations (STAs), wireless devices, wireless terminals and/or mobile stations. Terminals are enabled to communicate wirelessly in a wireless communications network, such as a Wireless Local Area Network (WLAN), or a cellular communications network sometimes also referred to as a cellular radio system or cellular networks. The communication may be performed e.g. between two terminals, between a terminal and a regular telephone and/or between a terminal and a server via an access network and possibly one or more core networks, comprised within the wireless communications network.

The above communications devices may further be referred to as mobile telephones, cellular telephones, laptops, tablets or sensors with wireless capability, just to mention some further examples. The communications devices in the present context may be, for example, portable, pocket-storable, hand-held, wall-mounted, computer-comprised, or vehicle-mounted mobile devices, enabled to communicate voice and/or data, via the access network, such as a Radio Access Network (RAN), with another entity, such as an Access Point (AP), another communications device or a server.

Energy efficiency is of paramount importance in many Internet of Things (IoT) applications because IoT devices, such as sensors and other devices, e.g. communications devices, are often battery powered and a long battery life is desired. Therefore, recent and future variants of the Institute of Electrical and Electronics Engineers (IEEE) 802.11 standard, such as the IEEE 802.11ah standard, must include features to improve the energy efficiency of the IoT devices. On the other hand, extended range is also an important feature for IoT applications, in order to reach places with high penetration losses, for outdoor applications, or simply to help balance the link budget. The IEEE 802.11ah standard includes a new Modulation and Coding Scheme (MCS) called MCS10 that adds a repetition code, e.g. a 2× repetition code, to the MCS0 channel code in order to improve the sensitivity by three (3) dB. There are currently efforts to standardize a Long Range Low Power (LRLP) mode in the IEEE 802.11 standard. Even for LRLP there is an interest in adding a repetition code in order to extend the range. Clearly, increasing the range and decreasing the power consumption are somewhat contradictory goals. Nonetheless both are very important and therefore standards that offer good compromises and flexibility to optimize one or the other according to the use case are sought.

The design of the IEEE 802.11ah air interface was guided by the principle of re-use of hardware and software, in order to make the air interface compatible with earlier versions of the standard. Backwards compatibility accelerates time to market and reduces costs. As an example, the IEEE 802.11ah standard inherited all the MCS from the IEEE 802.11ac standard, which enables the re-use of hardware accelerators that perform Viterbi decoding. Similarly, the current proposal for an enhancement of the IEEE 802.11 standard in the 2.4 GHz bands mentions compatibility with the IEEE 802.11ax standard.

Range extension in the IEEE 802.11ah standard is obtained by simple methods that are to a large extent backward compatible with previous versions of the standard. In addition to using sub 1 GHz carrier frequencies, the IEEE 802.11ah standard employs the following methods.

Firstly, it employs narrow radio frequency channels, which allow a transmitter, e.g. a transmitting node, to increase the power spectral density. The narrowest channel bandwidth in the IEEE 802.11ah standard is 1 MHz.

Secondly, it employs the repetition code, e.g. the 2× repetition code. A new MCS named MCS10 is created starting from the MCS0, e.g. the most robust MCS inherited from the IEEE 802.11ac standard, and adding a 2× repetition code. In theory, the range is increased by 3 dB, at the cost of doubling the length of the packets and doubling the energy consumption.

It should be noted that the design of the MCS10 has the merit of simplicity.

Even though the work in the LRLP area is still in its early stages, a repetition mode has been mentioned as a means to obtain range extension.

Wireless communications systems, such as LTE, have sophisticated retransmission mechanisms. The basic principle is that when a packet is not correctly decoded, a receiver, e.g. a receiving node, sends a non-acknowledgement (NACK) to the transmitting node and a retransmission, possibly with a different channel code, e.g. a different puncturing pattern, is sent from the transmitting node to the receiving node. The receiving node buffers the first packet and performs soft combining upon reception of the second packet. In the simplest retransmission scheme, the same channel code is applied to all the transmissions of the same data, and the receiving node simply buffers and accumulates the soft values for every received packet. This is sometimes referred to as chase combining.

Link adaptation is a term used in wireless communications to denote the matching of modulation, coding and other signal and protocol parameters to the conditions on a radio link, e.g. the radio channel. For IoT devices link adaptation is difficult because the IoT devices are active sporadically and may sleep for very long time periods, so it is difficult to gather reliable up-to-date statistics of the channel conditions. The right choice of the MCS at the AP is very important for energy efficiency. Choosing an MCS that is not robust enough leads to packet re-transmissions, which drains the battery. Similarly, choosing an MCS that is too robust, e.g. choosing the MCS10 when the MCS0 would have been enough, also leads to the unnecessary consumption of significant amounts of power.

The reception of broadcasted management frames such as beacons often consumes a substantial amount of energy. For example, in some cases the battery lifetime of an actuator STA is highly dependent on the beacon length and the beacon frequency, since more than 99% of the total energy consumption is devoted to the reception of beacons, while less than 1% of the energy is actually spent receiving the payload directed to the STA. In addition, broadcasting in the 802.11 systems is not energy efficient because the total time that all the receiving STAs need to be awake, with the RX window open, is determined by the link requirements of the STA with the lowest SNR. The reason is that the MCS used to modulate and code the packets must be robust enough so that the device with the weakest link and lowest SNR is able decode it, and the packet length is directly related to the MCS. For example, in the 802.11ah standard an MCS10 packet is roughly two times longer than an MCS0 packet with an identical payload. Thus, the energy consumed during the reception of an MCS0 packet carrying a given payload is roughly one half of the energy required to receive an MCS10 packet carrying the same payload.

Since energy efficiency is very important in battery operated IoT devices, energy efficient forms of channel coding for broadcasting and power efficient link adaptation methods are sought. For example, in a 802.11ah BSS where some STA's require range extension, the AP may have to encode the beacons using the MCS10, which implies a significant increase in the battery consumption for all those STA's that have moderate to high SNR and that would have been able to receive less robust MCS's, such as the MCS0 or an MCS1.

The article: "PHY Modifications of IEEE 802.11 Systems for transmission at very low SNR" to Langhammer et. al. XP031947907, ISBN 978-1-61284-885-3 discloses physical layer (PHY) modifications of the IEEE 802.11 systems to increase the SNR robustness and communication range by reusing common system components. A spreading code is applied which is equivalent to applying a repetition code. Thus, the disclosed modification may be seen as an alternative to applying a repetition code as in the MCS10 described above. Therefore, the drawback of the proposed modifications is the same as the drawback of applying the repetition code.

WO 2015/061729 A1 discloses a method for generating a physical layer (PHY) data unit for transmission via a communication channel. The PHY data unit conforms to a first communication protocol. Orthogonal frequency division multiplexing (OFDM) symbols for a data field of the PHY data unit are generated according to a range extension coding scheme that corresponds to a range extension mode of the first communication protocol. A preamble of the PHY data unit is generated, the preamble having i) a first portion that indicates a duration of the PHY data unit and ii) a second portion that indicates whether at least some OFDM symbols of the data field are generated according to the range extension coding scheme. The first portion of the preamble is formatted such that the first portion of the preamble is decodable by a receiving device that conforms to a second communication protocol, but does not conform to the first communication protocol, to determine the duration of the PHY data unit based on the first portion of the preamble. The PHY data unit is generated to include the preamble and the data field. WO 2015/061729 A1 provides a solution for range extension. However, the decoding is not energy efficient when receiving devices have good channel conditions. This aspect is critical in IoT applications where the receiving devices are battery powered.

SUMMARY

An object of embodiments herein is to address at least some of the above-mentioned drawbacks among others and to improve the performance in a communications network.

According to one aspect of embodiments herein, the object is achieved by a method performed by a transmitting node for providing enhanced channel coding of a packet transmitted in a wireless communications network. The transmitting node and a receiving node are operating in the wireless communications network.

The transmitting node applies, to payload data to be transmitted, an outer channel encoder resulting in a plurality of outer code bits.

Further, the transmitting node applies an inner channel encoder to the plurality of outer code bits.

Furthermore, the transmitting node divides resulting code bits of the inner channel encoder into a first group of bits comprising one or more bits of a first type and one or more second groups of bits comprising one or more bits of a second type.

Yet further, the transmitting node generates a first set of Orthogonal Frequency-Division Multiplexing (OFDM) symbols carrying at least a part of the first group of bits, and one or more second sets of OFDM symbols carrying at least a part of the one or more second groups of bits.

The transmitting node transmits, to the receiving node, a packet comprising the first set of OFDM symbols followed by the one or more second sets of OFDM symbols, whereby an enhanced channel coding of the transmitted packet is provided.

According to another aspect of embodiments herein, the object is achieved by a transmitting node for providing enhanced channel coding of a packet transmitted in a wireless communications network. The transmitting node and a receiving node are configured to operate in the wireless communications network.

The transmitting node is configured to apply, to payload data to be transmitted, an outer channel encoder resulting in a plurality of outer code bits.

Further, the transmitting node is configured to apply an inner channel encoder to the plurality of outer code bits.

Furthermore, the transmitting node is configured to divide resulting code bits of the inner channel encoder into a first group of bits comprising one or more bits of a first type and one or more second groups of bits comprising one or more bits of a second type.

Yet further, the transmitting node is configured to generate a first set of OFDM symbols carrying at least a part of the first group of bits, and one or more second sets of OFDM symbols carrying at least a part of the one or more second groups of bits.

The transmitting node is configured to transmit, to the receiving node, a packet comprising the first set of OFDM symbols followed by the one or more second sets of OFDM symbols, whereby an enhanced channel coding of the transmitted packet is provided.

According to another aspect of embodiments herein, the object is achieved by a method performed by a receiving node for enabling enhanced channel coding of a packet transmitted in a wireless communications network. A transmitting node and the receiving node are operating in the wireless communications network.

The receiving node receives, from the transmitting node, parts of a packet, which packet comprises a first set of OFDM symbols followed by one or more second sets of OFDM symbols. The first set of OFDM symbols carries at least a part of a first group of bits comprising bits of a first type, and the one or more second sets of OFDM symbols carry at least a part of one or more second groups of bits comprising bits of a second type.

When payload data is decodable from received parts comprising the first set of OFDM symbols, the receiving node decodes the payload data from the first set of OFDM symbols.

When payload data is unsuccessfully decoded from received parts comprising the first set of OFDM symbols, the receiving node decodes the payload data from the first set of OFDM symbols and the one or more second sets of OFDM symbols.

Further, the receiving node stops receiving parts of the packet when the payload data is decoded.

According to another aspect of embodiments herein, the object is achieved by a receiving node for enabling enhanced channel coding of a packet transmitted in a wireless communications network. A transmitting node and the receiving node are configured to operate in the wireless communications network.

The receiving node is configured to receive, from the transmitting node, parts of a packet, which packet comprises a first set of OFDM symbols followed by one or more second sets of OFDM symbols. The first set of OFDM symbols carries at least a part of a first group of bits comprising bits of a first type, and the one or more second sets of OFDM symbols carry at least a part of one or more second groups of bits comprising bits of a second type.

Furthermore, the receiving node is configured to decode the payload data from the first set of OFDM symbols when payload data is decodable from received parts comprising the first set of OFDM symbols.

Yet further, the receiving node is configured to decode the payload data from the first set of OFDM symbols and the one or more second sets of OFDM symbols when payload data is unsuccessfully decoded from received parts comprising the first set of OFDM symbols.

Further, the receiving node is configured to stop receiving parts of the packet when the payload data is decoded.

According to another aspect of embodiments herein, the object is achieved by a computer program, comprising instructions which, when executed on at least one processor, causes the at least one processor to carry out the method performed by the transmitting node.

According to another aspect of embodiments herein, the object is achieved by a computer program, comprising instructions which, when executed on at least one processor, causes the at least one processor to carry out the method performed by the receiving node.

According to another aspect of embodiments herein, the object is achieved by a carrier comprising the computer program, wherein the carrier is one of an electronic signal, an optical signal, a radio signal or a computer readable storage medium.

Since the transmitting node applies, to payload data to be transmitted, the outer channel encoder resulting in a plurality of outer code bits, since the transmitting node applies the inner channel encoder to the plurality of outer code bits, since the transmitting node generates the first set of OFDM symbols carrying at least a part of the first group of bits and generates one or more second sets of OFDM symbols carrying at least a part of the one or more second groups of bits, and since the transmitting node transmits, to the receiving node, a packet comprising the first set of OFDM symbols followed by the one or more second sets of OFDM symbols, the receiving node is able to determine whether to decode payload data from the first set of OFDM symbols alone or in combination with one or more out of the one or more second sets of OFDM symbols. Thereby, an enhanced channel coding of the packet is provided that results in an extended coverage range of the packet which enables receiving nodes needing range extension to decode payload from the packet while at the same time providing energy efficient decoding to receiving nodes not needing range extension. This results in an improved performance in the communications network.

An advantage with embodiments herein is that they provide an improved energy efficiency of the wireless communications network.

A further advantage with embodiments herein is that they provide range extension without increasing the awake time for receiving nodes having good channel conditions.

BRIEF DESCRIPTION OF DRAWINGS

Examples of embodiments herein are described in more detail with reference to attached drawings in which.

DETAILED DESCRIPTION

Figure 1:
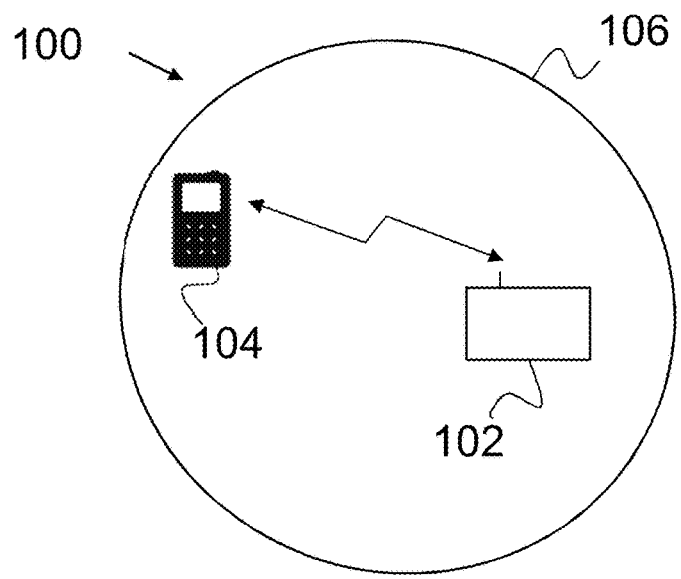
FIG. 1 is a schematic block diagram schematically illustrating embodiments of a communications network.

In order to facilitate understanding of embodiments herein, some problems with the state of the art communications networks will first be identified and discussed.

As mentioned above, link adaptation is difficult for IoT devices since they are active sporadically and may sleep for very long time periods, and therefore it is difficult to gather reliable up-to-date statistics of the channel conditions. The right choice of the MCS at the AP is very important for energy efficiency. Choosing an MCS that is not robust enough leads to packet re-transmissions, which drains the battery. Similarly, choosing an MCS that is too robust, e.g. choosing the MCS10 when the MCS0 would have been enough, also leads to the unnecessary consumption of significant amounts of power.

An object addressed by embodiments herein is therefore how to improve performance in a wireless communications network.

Therefore, as mentioned above, according to embodiments herein, a way of improving the performance in the wireless communications network is provided.

In order to overcome the above-mentioned drawback, embodiments herein provide an enhanced channel coding of a packet transmitted in a wireless communications network, whereby range extension is provided to receiving nodes needing range extension while providing energy efficient decoding of the packet to receiving nodes not needing range extension.

By the term "packet" when used in this disclosure is meant a unit of data, e.g. a formatted unit of data, which unit comprises control information and user data. The control information provides data for delivering the user data. For example, the control information may comprise: source and destination network addresses, error detection codes, and sequencing information, just to give some examples. Typically, control information is found in packet headers and trailers. The user data is sometimes referred to as payload data, or just payload. The packet may be a broadcasted packet such as a beacon, a multicasted packet or a unicasted packet.

By the expression "range extension" when used in this disclosure is meant that an existing set of modulation and coding schemes are concatenated with further channel codes to provide an extended range, e.g. an extended coverage range of a transmitted packet. Other means of extending the range of existing modulation and coding schemes have been disclosed in WO 2015/061729 A1 and "PHY Modifications of IEEE 802.11 Systems for transmission at very low SNR" to Langhammer et. al. XP031947907, ISBN 978-1-61284-885-3, however these do not address the important issue of energy efficient decoding in battery powered devices.

The addition of further channel codes to an existing set of modulation and coding schemes is sometimes referred to as enhanced channel coding in this disclosure. It is useful to provide an extended coverage range of a transmitted packet.

Some embodiments herein disclose an energy efficient method to perform channel coding and packet formatting. Further, some embodiments herein will be illustrated in the context of an Orthogonal Frequency-Division Multiplexing (OFDM) system similar to the system defined in the IEEE 802.11ac/ah/ax standards, although this example is non-limiting as the basic principles may be applied to other packet based wireless systems.

Note that although terminology from the WLAN technology is used in this disclosure to exemplify the embodiments herein, this should not be seen as limiting the scope of the embodiments herein to only the aforementioned system. Other wireless systems, including Low-Rate Wireless Personal Area Networks (LR-WPANs) as defined in e.g. IEEE 802.15.4, Wideband Code Division Multiple Access (WCDMA), Worldwide Interoperability for Microwave Access (WiMax), Ultra Mobile Broadband (UMB) and Global System for Mobile Communications (GSM), may also benefit from exploiting embodiments covered within this disclosure.

In this section, embodiments herein will be illustrated in more detail by a number of exemplary embodiments. It should be noted that these embodiments are not mutually exclusive. Components from one embodiment may be assumed to be present in another embodiment and it will be obvious to a person skilled in the art how those components may be used in the other exemplary embodiments.

FIG. 1 depicts an example of a wireless communications network 100 in which embodiments herein may be implemented. The wireless communications network 100 may be a WLAN, an LR-WPAN as defined in e.g. IEEE 802.15.4, an LTE network, a Wideband Code Division Multiple Access (WCDMA) network, a Global System for Mobile Communications (GSM) network, any 3GPP cellular network, Worldwide Interoperability for Microwave Access (WiMAX) network, a combination of one or more of the aforementioned communications networks.

A transmitting node 102 operates in the wireless communications network 100. Thus, the transmitting node 102 is configured to operate in the wireless communications network 100. The transmitting node 102 may be comprised in the wireless communications network 100.

The transmitting node 102 may be a network node such as an Access Node (AN), e.g. a wireless access node, such as a WLAN access node, an LR-WPAN access node, a radio access node or any node capable of transmitting data to a receiving node. The AN may be referred to as an Access Point (AP), and the terms AN and AP may be used interchangeably.

The radio access node may be a radio base station, for example an eNB, i.e. an eNodeB, or a Home Node B, an Home eNode B or any other network node capable to serve and/or communicate with a communications device in the communications network 100.

A receiving node 104 operates in the wireless communications network 100. Thus, the receiving device 104 is configured to operate in the wireless communications network 100. Further, the receiving device 104 may be comprised in the wireless communications network 100. The receiving device 104 may be a communications device such as an Internet of Thing (IoT) device, an LRLP device such as a sensor, a User Equipment (UE), or another node capable of receiving data from a transmitting node.

In some of the embodiments described herein the non-limiting term UE is used and it refers to any type of device communicating with a network node in a wireless communications network, e.g. the communications network 100. Examples of communications devices or UEs are stations (STAs), target devices, device to device UEs, machine type UEs or UEs capable of machine to machine communication, Personal Digital Assistants (PDA), iPADs, Tablets, mobile terminals, smart phones, Laptop Embedded Equipped (LEE), Laptop Mounted Equipment (LME), USB dongles etc.

In this disclosure the terms communications device and UE are used interchangeably. Further, it should be noted that the term user equipment used in this disclosure also covers other communications devices such as Machine Type of Communication (MTC) device, an Internet of Things (IoT) device, e.g. a Cellular IoT (CIoT) device. Please note the term user equipment used in this document also covers other communications devices such as Machine to Machine (M2M) devices, even though they do not have any user.

It should be understood that the transmitting node 102 and the receiving node 104 are configured to both receive and transmit transmissions even though embodiments described herein refer to them as the transmitting node and the receiving node, respectively. Thus, the transmitting node may be referred to as a first communication node or a first communication device, and the receiving node may referred to as a second communication node or a second communications device. Further, both communications nodes may be configured to receive and to transmit transmissions.

Further, the transmitting node 102 and the receiving node 104 are configured for wireless communication with each other when being located within radio coverage with each other, e.g. within a coverage area 106 served by one of the nodes, e.g. the transmitting node 102, having radio coverage within the coverage area 106. Herein, this is also specified as the transmitting node 102 manages or is configured to manage communication with the receiving node 104 in the coverage area 106. The coverage area 106 may be determined as the area where communication between the nodes are possible, given one or more constraints on, e.g., output power, required data rate and similar. In this disclosure, the coverage area 106 is sometimes also referred to as a cell or a cluster. Further, one or more nodes may be said to belong to the same Basic Serving Set (BSS) when they are operating within the coverage area 106.

An example of how the transmitting node 102 and the receiving node 104 may operate for providing enhanced channel coding of a packet transmitted in the communications network 100, will now be described with reference to the combined flowchart and signalling scheme depicted in FIG. 2. As previously mentioned, the transmitting node 102 and the receiving node 104 are operating in the wireless communications network 100.

Figure 2:
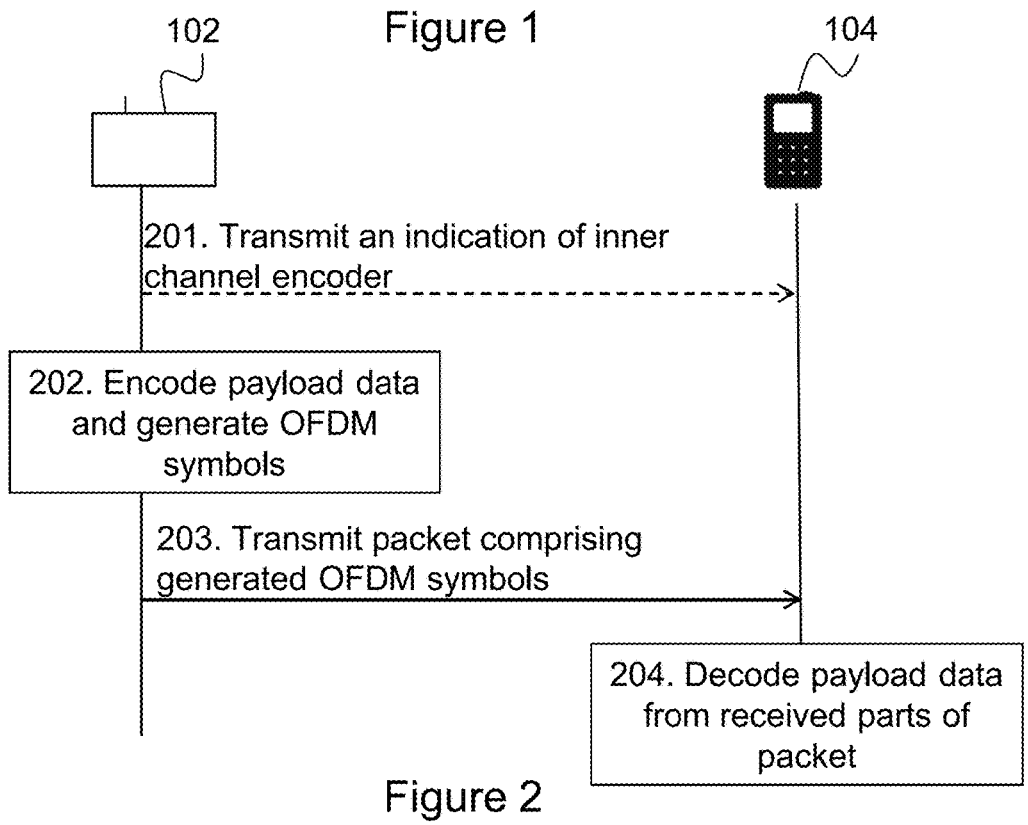
FIG. 2 is a schematic combined flowchart and signalling scheme of embodiments of a communications network.

The procedure depicted in FIG. 2 comprises one or more of the following actions. It should be understood that these actions may be taken in any suitable order and that some actions may be combined.

Action 201

In order to inform the receiving node 104 about an inner channel encoder used or that is to be used, the transmitting node 102 may transmit, to the receiving node 104, an indication of the inner channel encoder. The inner channel encoder may use a systematic encoder with low computational complexity, such as a single parity check encoder or a repetition encoder. Further, the inner channel encoder may be used when an extended range of the transmitted packet, e.g. a range extension, is desirable or required. For example, that may be the case when the transmitting node 102 and the receiving node 104 are located far away from each other, and when the transmitting node 102 therefore wants to extend the coverage for a packet to be transmitted so it is receivable by the receiving node 104.

Action 202

The transmitting node 102 encodes payload data to be transmitted and generates one or more OFDM symbols. The generated OFDM symbols comprise bits relating to the encoded payload data. The encoding will be described in more detail with reference to Actions 302-306 below.

However, in general terms, it could be said that the channel coding, e.g. the channel encoding, is split into two channel encoders; an outer channel encoder and an inner channel encoder. In this disclosures, the outer channel encoder and the inner channel encoder may be referred to as a first channel encoder and a second channel encoder, respectively.

The encoder may be seen as a means or device that takes an information stream and generates a code stream. A code is a set of code words, and thus a code stream is a stream of code words. It should be understood that several encoders may generate the same code. Such encoders are then said to be equivalent.

For example:

Encoder 1 does the mapping "0"→"000", and "1"→"111", and

Encoder 2 does the mapping "1"→"000" and "0"→"111"

The codes are the same, as the set of code words are the same, e.g. "000" and "111". The encoders Encoder 1 and Encoder 2 are different but equivalent as they generate the same code.

Thus, it should be understood that several different encoders, e.g. several different inner channel encoders, may generate the same code.

Further, the transmitting node 102 applies the outer channel encoder to payload data to be transmitted, and applies an inner channel encoder to a plurality of code bits resulting from the outer channel encoder. The outer channel encoder may be used to provide a channel encoding that adds extra redundancy bits to make a transmission of the packet on a transmission channel more robust to disturbances present on the transmission channel. As mentioned above, the inner channel encoder may be used to provide more redundancy bits when range extension is needed.

Furthermore, the transmitting node 102 generates the OFDM symbols such that a first set of OFDM symbols comprises bits of a first type, e.g. systematic bits, and such that one or more second set of OFDM symbols comprise bits of a second type, e.g. parity bits.

Action 203

The transmitting node 102 transmits, to the receiving node 104, a packet comprising the generated OFDM symbols. As will be described below, the packet is assembled such that the first set of OFDM symbols comprising bits of the first type, e.g. the systematic bits, is transmitted in the beginning of the packet, and such that the second set of OFDM symbols comprising bits of the second type, e.g. parity bits, is transmitted after the first set of OFDM symbols.

Action 204

The receiving node 104 decodes payload data from one or more received parts of the packet transmitted from the transmitting node 102. As will be described in more detail below in the Actions 604 and 1105, under some circumstances such as when the receiving node 104 is located close to the transmitting node 102, the receiving node 104 may be able to decode the payload data from parts of the packet comprising the first set of OFDM symbols. Further, as will be described in more detail below in the Actions 605 and 1106, under other circumstances, e.g. when the receiving node 104 is located far away from the transmitting node 102, the receiving node 104 may need to receive further parts of the packet, e.g. one or more of the second set of OFDM symbols in order to be able to decode the payload data. Thus, the further parts of the packet enables extension of the range within which the packet is receivable.

However, the receiving node 104 does not have to receive all the packet if it's able to decode the payload data from parts of the packet and therefore the receiving node 104 stops receiving further parts of the packet once it has decoded the payload data. Therefore, the energy consumption may be reduced as compared to the case when a receiving node 104 is located far away from the transmitting node 102 and has to receive the entire packet before being able to decode payload data.

Figure 3:
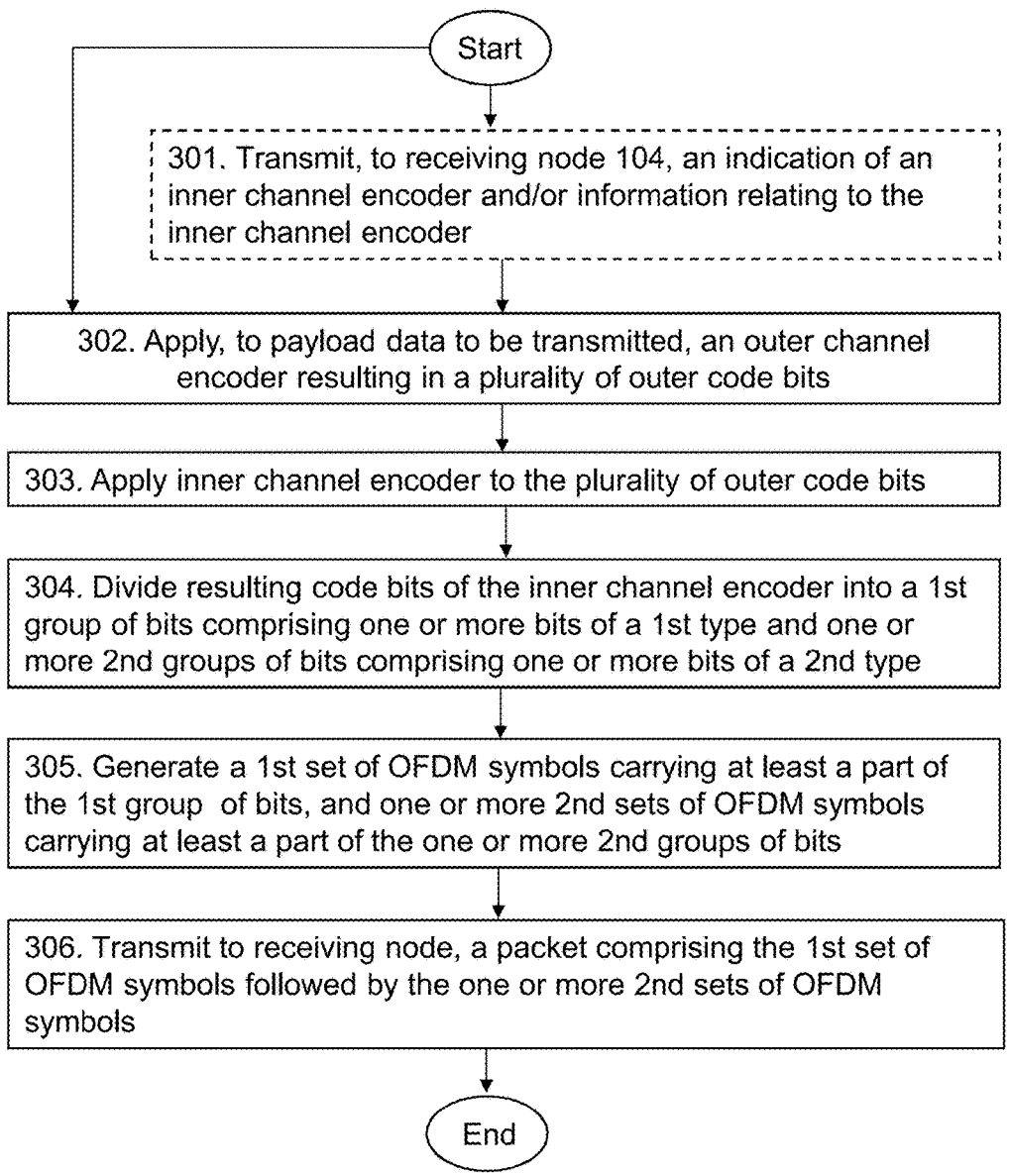
FIG. 3 is a flowchart schematically illustrating embodiments of a method performed by a transmitting node.

Examples of methods performed by the transmitting node 102 for providing enhanced channel coding of a packet transmitted in the wireless communications network 100 will now be described with reference to the flowchart depicted in FIG. 3.

As previously mentioned, the transmitting node 102 and the receiving node 104 are operating in the communications network 100.

The methods comprise one or more of the following actions. It should be understood that these actions may be taken in any suitable order and that some actions may be combined.

Action 301

In some embodiments, the transmitting node 102 transmits, to the receiving node 104, an indication of a presence of an inner channel encoder and/or information relating to the inner channel encoder. For example, this may be the case when the transmitting node 102 wants to inform the receiving node 104 about the presence of an inner channel encoder that is used or is to be used when transmitting the packet. This is in order to extend the coverage range within which range the packet is receivable by a receiving node, e.g. the receiving node 104.

The transmitting node 102 may transmit the indication and/or the information in a transmission preceding the transmission of the packet. This may be the case when transmitting node 102 in advance have knowledge about the inner channel encoder to be used when later on transmitting the packet.

However, in some embodiments, the indication and/or the information may be comprised in a physical layer (PHY) header of a preamble of the packet. In such embodiments, the indication and/or the information is transmitted with the packet that is transmitted in Action 306 below. Thus, when receiving parts of the packet, the receiving node 104 will also be informed about the inner channel encoder used by the transmitting node 102.

Action 302

The transmitting node 102 applies, to payload data to be transmitted, an outer channel encoder resulting in a plurality of outer code bits.

The outer channel encoder may be any one or more out of: an error detection encoder, an error correction encoder and a legacy Modulation and Coding Scheme (MCS) channel encoder. By the expression "legacy MCS channel encoder" when used in this disclosure is meant an MCS channel encoder according to the IEEE 802.11 standard. An example of a legacy MCS channel encoder is the so called MCS0 channel encoder.

Action 303

The transmitting node 102 applies an inner channel encoder to the plurality of outer code bits.

In some embodiments, the transmitting node 102 applies the inner channel encoder by applying any one or more out of: a single parity check encoder to the plurality of outer code bits, and a repetition encoder to the plurality of outer code bits.

For example, the single parity check encoder may be a rate 2/3 single parity check encoder with a systematic encoder and a generator matrix, or a rate 3/4 single parity check encoder with a systematic encoder.

Action 304

The transmitting node 102 divides resulting code bits of the inner channel encoder into a first group of bits comprising one or more bits of a first type and one or more second groups of bits comprising one or more bits of a second type.

For example, the bits of the first type may be systematic bits, and the bits of the second type may be parity bits.

A systematic encoder produces an output in which the input data is embedded in the encoded output. This means that the output of the encoder contains an exact replica of the input bits. These bits are called the systematic bits. A systematic encoder also produces a second output which are called parity bits. In this disclosure, the inner channel encoder may be a systematic encoder. Further, in this disclosure, by the term "systematic bits" is meant the systematic bits produced as output of the inner systematic encoder.

It should be understood that the first group of bits may comprise one or more other bits than the one or more bits of the first type. For example, the first group of bits may comprise one or more padding or filling bits. This may for example be the case when the total number of code bits is not evenly matched with the number of bits that may be mapped into an integer number of OFDM symbols.

Action 305

The transmitting node 102 generates a first set of OFDM symbols carrying at least a part of the first group of bits, and one or more second sets of OFDM symbols carrying at least a part of the one or more second groups of bits.

For example, the first set of OFDM symbols may comprise a first part of the first group of bits. In such example, a first second set of OFDM symbols (e.g. a first one of the second sets of OFDM symbols such as the first one of the second sets of OFDM symbols) may comprise a second part of the first group of bits and a first part of the one or more second groups of bits. Further, in such example, a second second set of OFDM symbols (e.g. a second one of the second sets of OFDM symbols such as the seconds one of the second sets of OFDM symbols) may comprise a second part of the one or more second groups of bits. However, it should be understood that other examples exist but the first set of OFDM symbols always comprises all or parts of the first group of bits.

In some embodiments, the first set of OFDM symbols comprises a number of code bits out of the plurality of outer code bits, and the second set of OFDM symbols comprises parity bits generated by the inner channel encoder. Thus, it should be understood that the first set of OFDM symbols does not have to comprise all of the plurality of outer code bits. For example, the number of code bits out of the plurality of outer code bits may be less than the number of the plurality of outer code bits. However, in some embodiments, the first set of OFDM symbols comprises all of the plurality of outer code bits.

Action 306

The transmitting node 102 transmits, to the receiving node 104, a packet comprising the first set of OFDM symbols followed by the one or more second sets of OFDM symbols, whereby an enhanced channel coding of the transmitted packet is provided.

In some embodiments, the first set of OFDM symbols and the one or more second sets of OFDM symbols are comprised in the packet in a consecutive order such that the first set of OFDM symbols is transmitted before a first second set of OFDM symbols out of the one or more second sets of OFDM symbols.

Figure 4:
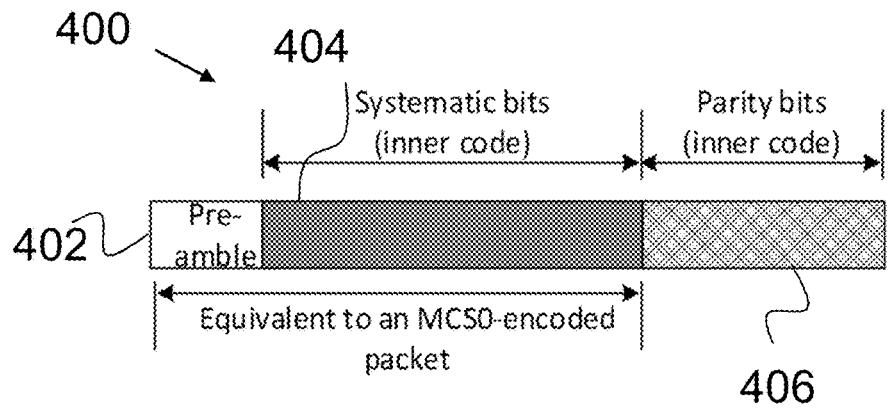
FIG. 4 is an example packet generated according to some embodiments.

FIG. 4 schematically illustrates an exemplary packet 400 generated according to embodiments described herein. As schematically illustrated the packet 400 comprises a preamble 402, a first set of OFDM symbols 404 comprising bits of the first type, e.g. the systematic bits, and one or more second set of OFDM symbols 406 comprising bits of the second type, e.g. the parity bits. As schematically illustrated in FIG. 4, a packet only comprising the preamble 402 and the first set of OFDM symbols 404 is equivalent to a legacy MCS0-encoded packet, while the packet 400 generated according to some embodiments disclosed herein comprises the preamble, the first set of OFDM symbols 404 and the one or more second sets of OFDM symbols 406. The one or more second sets of OFDM symbols 406 enables extended range for the transmission of the packet 400, whereby the packet 400 may be detectable by a receiving node, e.g. the receiving node 104, needing range extension.

Figure 5:
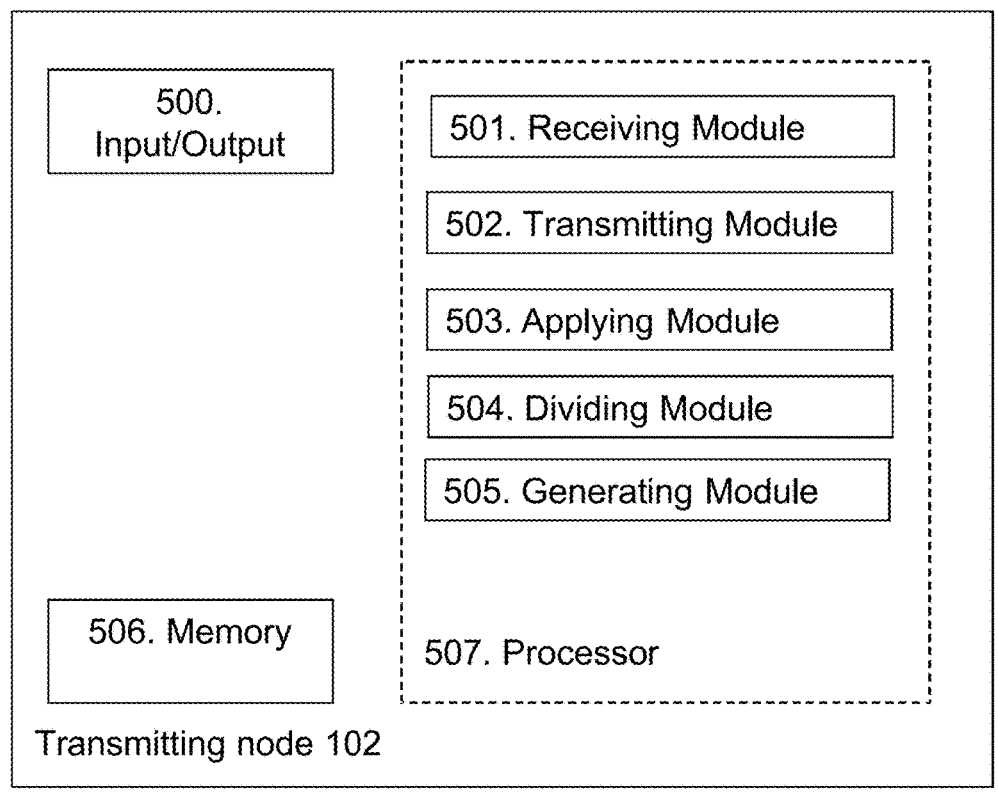
FIG. 5 is a schematic block diagram schematically illustrating embodiments of a transmitting node.

To perform the method for providing enhanced channel coding of a packet transmitted in the wireless communications network 102, the transmitting node 102 may be configured according to an arrangement depicted in FIG. 5. As previously perform the mentioned, the transmitting node 102 and the receiving node 104 are configured to operate in the wireless communications network 100.

The transmitting node 102 comprises an input and output interface 500 configured to communicate, with one or more nodes, e.g. the receiving node 104, operating in the wireless communications network 100. The input and output interface 500 may comprise a wireless receiver (not shown) and a wireless transmitter (not shown).

The transmitting node 102 is configured to receive, e.g. by means of a receiving module 501 configured to receive, a transmission from one or more nodes, e.g. the receiving node 104, operating in the wireless communications network 100. The receiving module 501 may be implemented by or arranged in communication with a processor 507 of the transmitting node 102. The processor 507 will be described in more detail below.

The transmitting node 102 is configured to transmit, e.g. by means of a transmitting module 502 configured to transmit, a transmission to one or more nodes, e.g. the receiving node 104, operating in the wireless communications network 100. The transmitting module 502 may be implemented by or arranged in communication with the processor 507 of the transmitting node 102.

Especially, the transmitting node 102 is configured to transmit, to the receiving node 104, a packet, e.g. the packet 400, comprising a first set of OFDM symbols, e.g. the first set of OFDM symbols 404, followed by one or more second sets of OFDM symbols, e.g. one or more second sets of OFDM symbols 406. Thereby, an enhanced channel coding of the transmitted packet is provided.

Further, in some embodiments, the transmitting node 102 is configured to transmit, to the receiving node 104, an indication of the presence of the inner channel encoder and/or information relating to the inner channel encoder.

The transmitting node 102 may be configured to transmit the indication and/or the information in a separate transmission preceding the transmission of the packet. However, in some embodiments, the transmitting node 102 is configured to transmit the indication and/or the information in the PHY header of the preamble of the packet.

The transmitting node 102 may be configured to apply, e.g. by means of an applying module 503 configured to apply, a first code to payload data to be transmitted and a second code to code bits resulting from the applied first code. The applying module 503 may be implemented by or arranged in communication with the processor 507 of the transmitting node 102.

Especially, the transmitting node 102 is configured to apply, to payload data to be transmitted, an outer channel encoder resulting in a plurality of outer code bits, and configured to apply an inner channel encoder to the plurality of outer code bits.

In some embodiments, the transmitting node 102 is configured to apply the inner channel encoder by further being configured to apply one or more out of: a single parity check code to the plurality of outer code bits and a repetition code to the plurality of outer code bits.

The outer channel encoder may be one or more out of: an error detection encoder, an error correction encoder and a legacy MCS channel encoder. As previously mentioned, by the expression "legacy MCS channel encoder" when used in this disclosure is meant an MCS channel encoder according to the IEEE 802.11 standard.

The transmitting node 102 is configured to divide, e.g. by means of a dividing module 504 configured to divide, resulting code bits of the inner channel encoder into a first group of bits comprising one or more bits of a first type and one or more second groups of bits comprising one or more bits of a second type. The dividing module 504 may be implemented by or arranged in communication with the processor 507 of the transmitting node 102.

The transmitting node 102 may be configured to generate, e.g. by means of a generating module 505 configured to generate, a first set of OFDM symbols carrying at least a part of the first group of bits, and one or more second sets of OFDM symbols carrying at least a part of the one or more second groups of bits. The generating module 505 may be implemented by or arranged in communication with the processor 507 of the transmitting node 102.

In some embodiments, the first set of OFDM symbols comprises a number of code bits out of the plurality of outer code bits, and the second set of OFDM symbols comprises parity bits generated by the inner channel encoder.

Further, the first set of OFDM symbols and the one or more second sets of OFDM symbols may be comprised in the packet in a consecutive order such that the first set of OFDM symbols is transmitted before a first second set of OFDM symbols out of the one or more second sets of OFDM symbols.

The transmitting node 102 may also comprise means for storing data. In some embodiments, the transmitting node 102 comprises a memory 506 configured to store the data. The data may be processed or non-processed data and/or information relating thereto. The memory 506 may comprise one or more memory units. Further, the memory 506 may be a computer data storage or a semiconductor memory such as a computer memory, a read-only memory, a volatile memory or a non-volatile memory. The memory is arranged to be used to store obtained information, data, configurations, schedulings, and applications etc. to perform the methods herein when being executed in the transmitting node 102.

Embodiments herein for providing enhanced channel coding of a packet may be implemented through one or more processors, such as the processor 507 in the arrangement depicted in FIG. 5, together with computer program code for performing the functions and/or method actions of embodiments herein. The program code mentioned above may also be provided as a computer program product, for instance in the form of a data carrier carrying computer program code for performing the embodiments herein when being loaded into the transmitting node 102. One such carrier may be in the form of an electronic signal, an optical signal, a radio signal or a computer readable storage medium. The computer readable storage medium may be a CD ROM disc or a memory stick.

The computer program code may furthermore be provided as program code stored on a server and downloaded to the transmitting node 102.

Those skilled in the art will also appreciate that the input/output interface 500, the receiving module 501, the transmitting module 502, the applying module 503, the dividing module 504, and the generating module 505 above may refer to a combination of analog and digital circuits, and/or one or more processors configured with software and/or firmware, e.g. stored in the memory 506, that when executed by the one or more processors such as the processors in the transmitting node 102 perform as described above. One or more of these processors, as well as the other digital hardware, may be included in a single Application-Specific Integrated Circuitry (ASIC), or several processors and various digital hardware may be distributed among several separate components, whether individually packaged or assembled into a System-on-a-Chip (SoC).

Examples of methods performed by the receiving node 104 for enabling enhanced channel coding of a packet transmitted in the wireless communications network 100 will now be described with reference to the flowchart depicted in FIG. 6. As previously mentioned, the transmitting node 102 and the receiving node 104 are configured to operate in the communications network 100.

The methods comprise one or more of the following actions. It should be understood that these actions may be taken in any suitable order and that some actions may be combined.

Action 601

In some embodiments, the receiving node 104 receives, from the transmitting node 102, an indication of the presence of the inner channel encoder, and/or information relating to the inner channel encoder.

The indication and/or the information may be comprised in a PHY header of the preamble of the packet.

Action 602

The receiving node 104 receives, from the transmitting node 102, parts of a packet, e.g. the packet 400, which packet comprises a first set of OFDM symbols, e.g. the first set of OFDM symbols 404, followed by one or more second sets of OFDM symbols, e.g. one or more second sets of OFDM symbols 406. The first set of OFDM symbols carries at least a part of a first group of bits comprising bits of a first type, and the one or more second sets of OFDM symbols carry at least a part of one or more 15 second groups of bits comprising bits of a second type.

In some embodiments, the first set of OFDM symbols and the one or more second sets of OFDM symbols are comprised in the packet in a consecutive order such that the first set of OFDM symbols is received before a first second set of OFDM symbols out of the one or more second sets of OFDM symbols.

Action 603

The receiving node 104 may determine if the payload data is successfully decodable from received parts comprising the first set of OFDM symbols based on an estimation of a channel quality.

As previously mentioned, the first set of OFDM symbols comprises bits of a first type, e.g. systematic bits, and the one or more second sets of symbols comprises bits of a second type, e.g. parity bits.

Thus, the receiving node 104 may determine if the payload data is decodable from the received parts comprising the systematic bits, or if further parts of the packet comprising parity bits are needed in order for the receiving node 104 to be able to decode the payload data.

Consequently, the receiving node 104 may determine at an early stage, e.g. before receiving the entire packet, whether to receive the entire packet or only the parts carrying the systematic bits. Further, even if the receiving node 104 receives the whole packet, it may decide whether it is necessary to use one or more of the received parts of the packet comprising the parity bits to decode the payload.

In some embodiments, the receiving node 104 determines if the payload data will be successfully decoded from the one or more received parts comprising the first set of OFDM symbols comprising systematic bits based on an estimation of a Signal-to-Noise Ratio (SNR).

Additionally or alternatively, the receiving node 104 may determine whether or not the payload data will be successfully decoded from the one or more received parts comprising the first set of OFDM symbols based on channel or SNR estimates. For example, the receiving node 104 may use training fields present in the packet in order to obtain channel and SNR estimates which are required prior to the decoding of the payload data. Using these estimates it is known in the art how to estimate the capacity of the channel. When the estimated capacity exceeds the actual rate of transmission, it may be enough to use the first set of OFDM symbols to successfully decode the payload. As an example, suppose that the receiving node 104 estimates the SNR to be dB, but that the typical SNR required to decode the packet, given the channel code used in the outer channel encoder, is 3 dB. Then the receiving node 104 proceeds to decode the payload data based only on the first set of OFDM symbols.

Action 604

When payload data is decodable from received parts comprising the first set of OFDM symbols, the receiving node 104 decodes the payload data from the first set of OFDM symbols.

In some embodiments, the receiving node 104 decodes the payload data from the first set of OFDM symbols by applying, to the first set of OFDM symbols, an outer channel decoder resulting in decoded payload data.

A decoder is a means or a device that takes a code stream and generate an information stream. Thus, a decoder may be seen as a means or a device corresponding to the encoder but operating in the reverse direction as compared to the encoder.

The outer channel decoder may be a convolution decoder, a Low Density Parity Check Code (LDPC) decoder, or a Cyclic Redundancy Check Code (CRC) decoder, or a combination thereof. For example, an CRC decoder may be used together with a convolution decoder and an LDPC decoder.

Action 605

When payload data is unsuccessfully decoded from received parts comprising the first set of OFDM symbols, the receiving node 104 decodes the payload data from the first set of OFDM symbols and the one or more second sets of OFDM symbols.

In some embodiments, the receiving node 104 decodes the payload data from the first set of OFDM symbols and the one or more second sets of OFDM symbols by applying a plurality of decoders. Firstly, the receiving node 104 may apply, to the first set of OFDM symbols, an outer channel decoder resulting in unsuccessful decoding. Secondly, the receiving node 104 may apply, to a first one of the one or more second sets of OFDM symbols, an inner decoder resulting in a plurality of outer code bits, and thirdly the receiving node 104 may apply, to the plurality of outer code bits the outer channel decoder resulting in decoded payload data.

Action 606

The receiving node 104 stops receiving parts of the packet when the payload data is decoded. Thus, when the receiving node 104 has decoded the payload data from received parts of the packet it will defer from receiving further parts of the packet. Consequently, not the entire packet is needed to be received in case the receiving node 104 is successful in decoded the payload data from received parts of the packet. This causes a reduction in the energy consumed for receiving the payload data as compared to the case when the entire packet has to be received in order to be able to decode the payload data.

Figure 7:
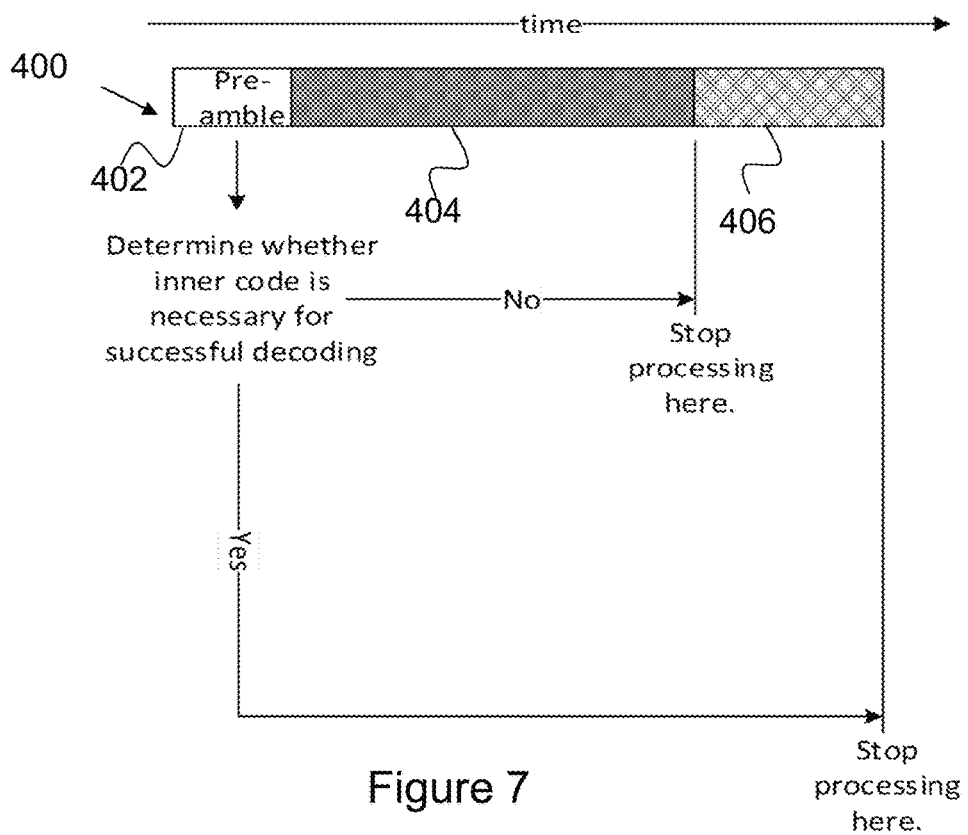
FIG. 7 is a schematic combined exemplary packet and flowchart schematically illustrating a method performed by a receiving node.

FIG. 7 schematically illustrates a combined flowchart and block diagram of the exemplary packet 400. As previously described, the packet 400 comprises the preamble 402, the first set of OFDM symbols 404 comprising bits of the first type, e.g. the systematic bits, and the one or more second set of OFDM symbols 406 comprising bits of the second type, e.g. the parity bits.

Systematic bits, e.g. the systematic bits comprised in the first set of OFDM symbols 404, may be sufficient for the receiving node 104 to be able to successfully decode payload data, e.g. one or more Media Access Control Service Data Units (MSDUs). Hence, receiving nodes, e.g. the receiving node 104, having high SNR may stop processing at an early stage, e.g. after the processing of the first set of OFDM symbols 404 without processing parts of the one or more second sets of OFDM symbols 406, while only those receiving nodes really requiring range extension need to receive, demodulate and decode one or more of the second sets of OFDM symbols 406 in addition to the first set of OFDM symbols 404 in order to be able to decode the payload data comprised in a broadcasted packet such as a beacon. Thus, some receiving nodes, e.g. the receiving node 104, having high SNR may save energy, while no receiving node is penalized in any way.

Figure 8:
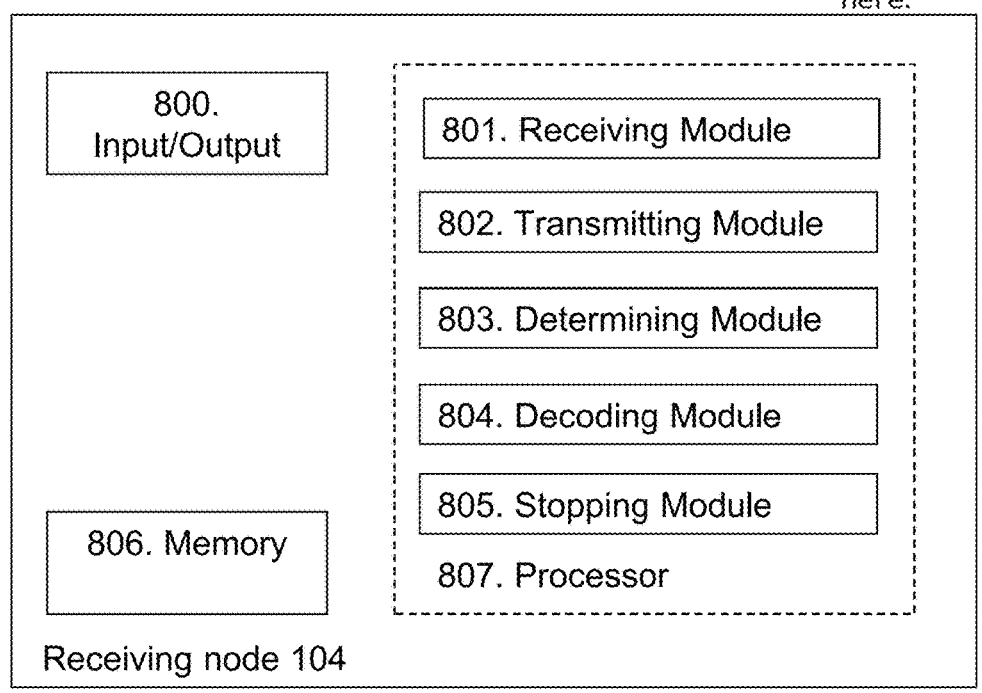
FIG. 8 is a block diagram schematically illustrating embodiments of receiving node.

To perform the method for enabling enhanced channel coding of a packet transmitted in the wireless communications network 100, the receiving node 104 may be configured according to an arrangement depicted in FIG. 8. As previously mentioned, the transmitting node 102 and the receiving node 104 are configured to operate in the wireless communications network 100.

The receiving node 104 comprises an input and output interface 800 configured to communicate with one or more network nodes, e.g. the transmitting node 102. The input and output interface 800 may comprise a wireless receiver (not shown) and a wireless transmitter (not shown).

The receiving node 104 is configured to receive, e.g. by means of a receiving module 801 configured to receive, parts of a packet from one or more network nodes, e.g. from the transmitting node 102. The receiving module 801 may be implemented by or arranged in communication with a processor 807 of the receiving node 104. The processor 807 will be described in more detail below.

As previously mentioned, the packet comprises a first set of OFDM symbols followed by one or more second sets of OFDM symbols. Further, the first set of OFDM symbols carries at least a part of a first group of bits comprising bits of a first type, and the one or more second sets of OFDM symbols carry at least a part of one or more second groups of bits comprising bits of a second type.

The first set of OFDM symbols and the one or more second sets of OFDM symbols may be comprised in the packet in a consecutive order such that the first set of OFDM symbols is received before a first second set of OFDM symbols out of the one or more second sets of OFDM symbols.

In some embodiments, the receiving node 104 is configured to receive, from the transmitting node 102, an indication of a presence of an inner channel encoder, and/or information relating to the inner channel encoder.

The indication and/or the information may be comprised in a PHY header of a preamble of the packet.

The receiving node 104 is configured to transmit, e.g. by means of a transmitting module 802 configured to transmit, a transmission to one or more network nodes, e.g. to the transmitting node 102. The transmitting module 802 may be implemented by or arranged in communication with the processor 807 of the receiving node 104.

The receiving node 104 may be configured to determine, e.g. by means of a determining module 803 configured to determine, if the payload data is successfully decodable from received parts comprising the first set of OFDM symbols based on an estimation of a channel quality. The determining module 803 may be implemented by or arranged in communication with the processor 807 of the receiving node 104.

The receiving node 104 is configured to decode, e.g. by means of a decoding module 604 configured to decode, payload data. The decoding module 804 may be implemented by or arranged in communication with the processor 807 of the receiving node 104.

The receiving node 104 is configured to decode the payload data from the first set of OFDM symbols when the payload data has been determined to be decodable from received parts comprising the first set of OFDM symbols.

In some embodiments, the receiving node 104 is configured to decode the payload data from the first set of OFDM symbols by further being configured to apply, to the first set of OFDM symbols, an outer channel decoder resulting in decoded payload data.

The outer channel decoder may be a convolution decoder, an LDPC decoder, a CRC decoder, or a combination thereof.

Further, the receiving node 104 is configured to decode the payload data from the first set of OFDM symbols and the one or more second sets of OFDM symbols, when the payload data is unsuccessfully decoded from received parts comprising the first set of OFDM symbols.

In some embodiments, the receiving node 104 is configured to decode the payload data from the first set of OFDM symbols and the one or more second sets of OFDM symbols by further being configured to apply a plurality of decoders. Firstly, the receiving node 104 is configured to apply, to the first set of OFDM symbols, the outer channel decoder resulting in unsuccessful decoding. Secondly, the receiving node 104 is configured to apply, to a first one of the one or more second sets of OFDM symbols, an inner decoder resulting in a plurality of outer code bits. Thirdly, the receiving node 104 is configured to apply, to the plurality of outer code bits the outer channel decoder resulting in decoded payload data.

The receiving node 104 is configured to stop, e.g. by means of a stopping module 805 configured to stop, receiving parts of the packet when the payload data is decoded. The stopping module 805 may be implemented by or arranged in communication with the processor 807 of the receiving node 104.

The receiving node 104 may also comprise means for storing data. In some embodiments, the receiving node 104 comprises a memory 806 configured to store the data. The data may be processed or non-processed data and/or information relating thereto. The memory 806 may comprise one or more memory units. Further, the memory 806 may be a computer data storage or a semiconductor memory such as a computer memory, a read-only memory, a volatile memory or a non-volatile memory. The memory is arranged to be used to store obtained information, data, configurations, schedulings, and applications etc. to perform the methods herein when being executed in the receiving node 104.

Figure 6:
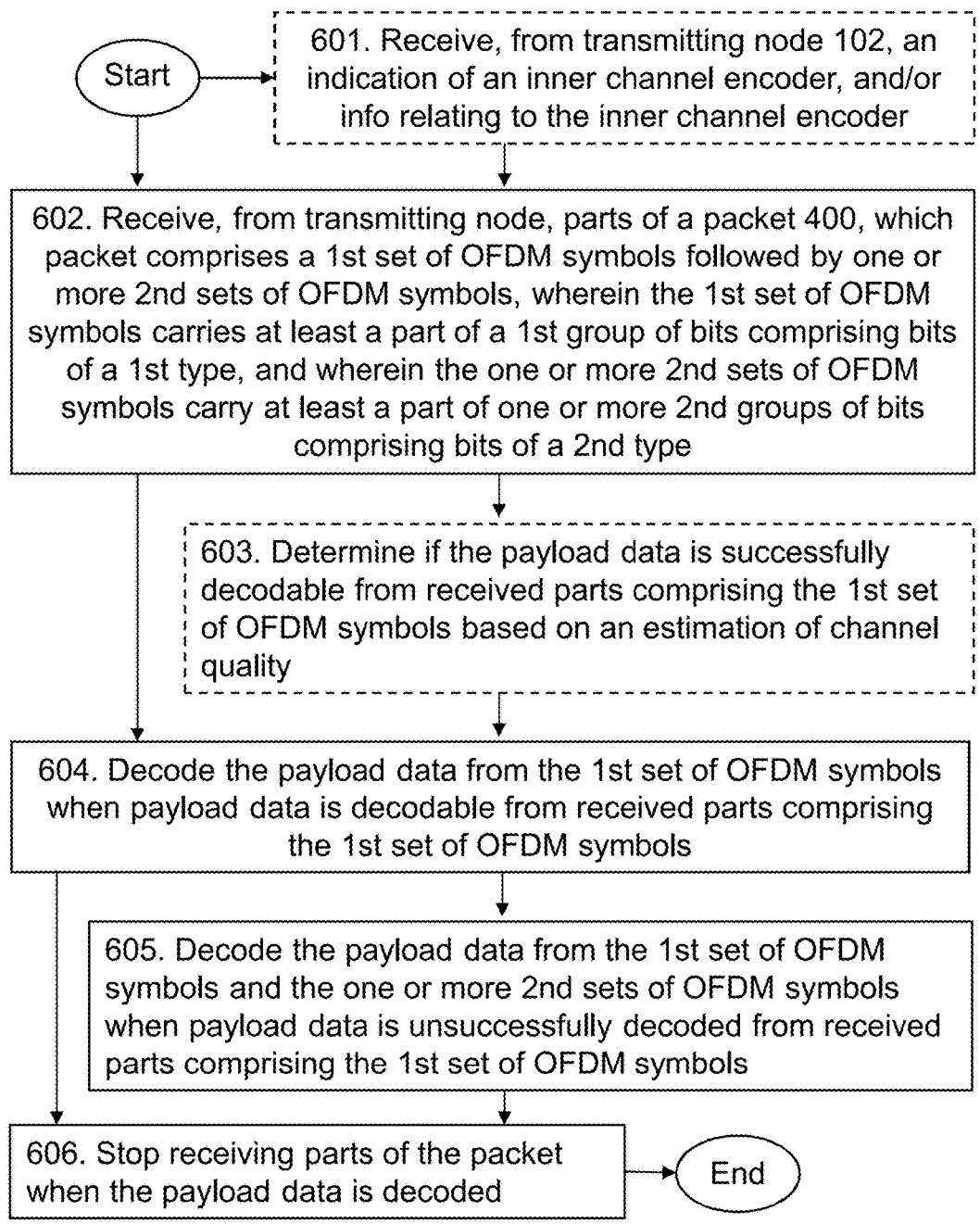
FIG. 6 is a flowchart schematically illustrating embodiments of a method performed by a receiving node.

Embodiments herein for enabling enhanced channel coding of a packet transmitted in the wireless communications network 100 may be implemented through one or more processors, such as the processor 807 in the arrangement depicted in FIG. 6, together with computer program code for performing the functions and/or method actions of embodiments herein. The program code mentioned above may also be provided as a computer program product, for instance in the form of a data carrier carrying computer program code for performing the embodiments herein when being loaded into the receiving node 104. One such carrier may be in the form of an electronic signal, an optical signal, a radio signal or a computer readable storage medium. The computer readable storage medium may be a CD ROM disc or a memory stick.

The computer program code may furthermore be provided as program code stored on a server and downloaded to the receiving node 104.

Those skilled in the art will also appreciate that the input/output interface 800, the receiving module 801, the transmitting module 802, the determining module 803, the decoding module 804, and the stopping module 805 above may refer to a combination of analog and digital circuits, and/or one or more processors configured with software and/or firmware, e.g. stored in the memory 806, that when executed by the one or more processors such as the processors in the receiving node 104 perform as described above. One or more of these processors, as well as the other digital hardware, may be included in a single Application-Specific Integrated Circuitry (ASIC), or several processors and various digital hardware may be distributed among several separate components, whether individually packaged or assembled into a System-on-a-Chip (SoC).

Some Exemplifying Procedures

Figure 9:
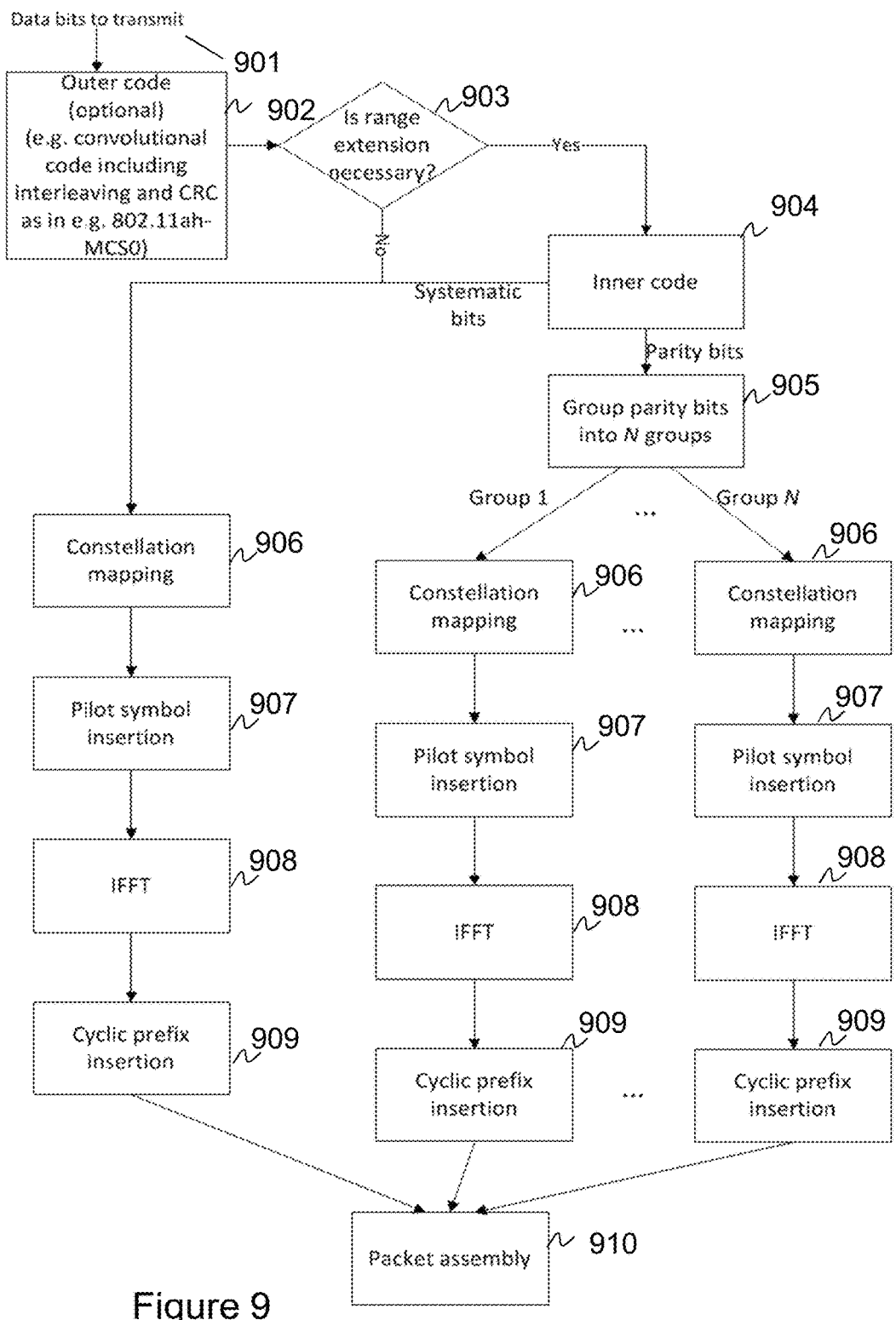
FIG. 9 is a flowchart schematically illustrating exemplary embodiments of a method performed by a transmitting node.

FIG. 9 schematically illustrates a schematic flowchart of some first exemplifying procedures performed by the transmitting node 102. The exemplifying procedures comprise one or more of the following actions. It should be understood that these actions may be taken in any suitable order and that some actions may be combined.

Action 901

The transmitting node 102 receives payload data from a higher layer, e.g. a Logical Link Control (LLC) layer. The payload data is the data to be transmitted by the transmitting node 102.

Action 902

The transmitting node 102 applies an outer channel encoder to the data. This relates to Action 302 previously described.

As previously mentioned, in some embodiments this outer channel encoder is as specified in the IEEE 802.11 standard. For example the MCS definitions in 802.11n/ac/ah/ax may be used. Interleaving, puncturing and error detection codes (e.g. CRC) may also be included as part of the outer channel encoder. This step may be optional. Omitting the outer channel encoder might be useful in order to decrease the cost and complexity of the receiving node 104, and also to diminish the energy consumption at the receiving node 104.

Action 903

The transmitting node 102 may determine whether or not range extension is necessary. This decision may depend on the output of a link adaptation algorithm, but may also depend on the nature of the data to be transmitted. For example, certain management frames such as beacons to be broadcasted may require range extension.

Action 904

If range extension is needed the code bits, which are the output of the outer channel encoder, are sent to an inner channel encoder, e.g. to a systematic inner channel encoder. This relates to Action 303 previously described.

In some embodiments, the inner channel encoder has very low encoding and decoding complexity code, such as a single parity check encoder or a repetition encoder. The output of the inner channel encoder is divided into systematic bits and parity bits. The systematic bits are processed according to Actions 906-909 which will be describe below. For example, the inner channel encoder's systematic code bits are modulated, e.g. as in an IEEE 802.11 OFDM transmitting node. In some embodiments, the systematic bits are mapped to constellation symbols, e.g. to Quadrature Amplitude Modulation (QAM) symbols or Phase-Shift Keying (PSK) complex-valued symbols, one or more pilot symbols are inserted, blocks of constellation symbols are transformed to the time domain via an Inverse Fast Fourier Transformation (IFFT), and a cyclic prefix is inserted to each OFDM symbol.

Action 905

The transmitting node 102 groups the parity bits into one or more groups, e.g. into N groups. This relates to Action 304 previously described.

Actions 906-909

If range extension is not needed, then the transmitting node 102 continues processing as in an IEEE 802.11 OFDM based system. For example, the bits are mapped to constellation symbols, e.g. QAM or PSK complex-valued symbols, in Action 906, pilot symbols are inserted in Action 907, blocks of constellation symbols are transformed to the time domain via the IFFT in Action 908, and a cyclic prefix is inserted to each OFDM symbol in Action 909.

If range extension is needed, the systematic bits are processed according to the Actions 906-909. For example, the inner channel encoder's systematic code bits are modulated, e.g. as in an IEEE 802.11 OFDM transmitting node. In some embodiments, systematic bits are mapped to constellation symbols, e.g. QAM or PSK complex-valued symbols, pilot symbols are inserted, blocks of constellation symbols are transformed to the time domain via the IFFT, and a cyclic prefix is inserted to each OFDM symbol.

Further, if range extension is needed, each of the N inner code parity bit-groups are modulated, for example as in an IEEE 802.11 OFDM transmitting node. In some embodiments, these parity bits are mapped to constellation symbols, e.g. QAM or PSK complex-valued symbols, pilot symbols are inserted, blocks of constellation symbols are transformed to the time domain via the IFFT, and a cyclic prefix is inserted to each OFDM symbol.

This relates to Action 305 previously described.

Action 910

Figure 10:
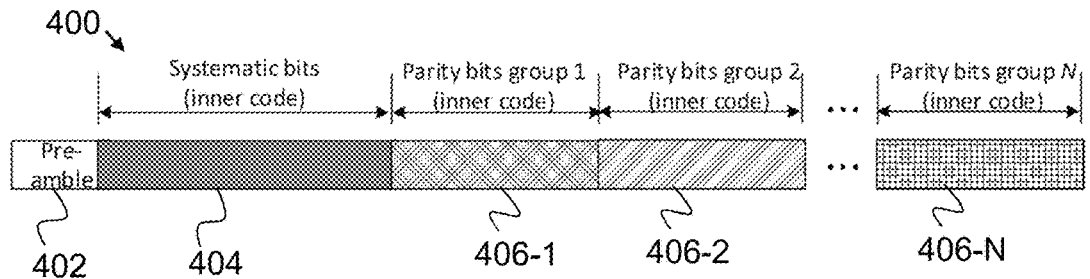
FIG. 10 is an example packet generated according to some embodiments.

The transmitting node 102 assemblies the packet, e.g. the packet 400, such that a preamble 402 comprising a PHY header is appended at the beginning of the packet. The OFDM symbols carrying systematic inner code bits, e.g. the first set of OFDM symbols 404, follow the preamble, followed by the OFDM symbols carrying inner code parity bits belonging to the first group, e.g. a first second set of OFDM symbols 406-1 out of the one or more second set of OFDM symbols. The rest of the OFDM symbols, e.g. a third second set of OFDM symbols 406-3 to an N:th second set of OFDM symbols 406-N, follow in such a way that the OFDM symbols carrying inner channel code parity bits belonging to one group are consecutive. Thus the systematic bits are transmitted first, followed by the parity bits belonging to the first group 406-1, followed by the parity bits belonging to the second group 406-2, etc., as schematically shown in FIG. 10.

In some embodiments, the PHY header comprises information describing the presence of the inner channel code, e.g. the inner channel encoder, and its characteristics.

This relates to Action 305 previously described.

The transmitting node 102 transmits the packet. This relates to Action 306 previously described.

In some embodiments, the transmitting node 102 also signals to the receiving node 104 that an inner channel encoder has been applied. This relates to Action 301 previously described. The details on the new procedures introduced by embodiments disclosed herein may be agreed in a specification, such as the IEEE specification e.g. part of management frames such as beacon frame or association response frame. This may also be implemented as vendor specific signalling.

Alternatively or additionally, the inner channel encoder is always present and it is not necessary to signal it to the receiving node 104. In such embodiments, the transmitting node 102 may refrain from executing Action 903 described above and relating to the determination of whether or not range extension is needed.

Figure 11:
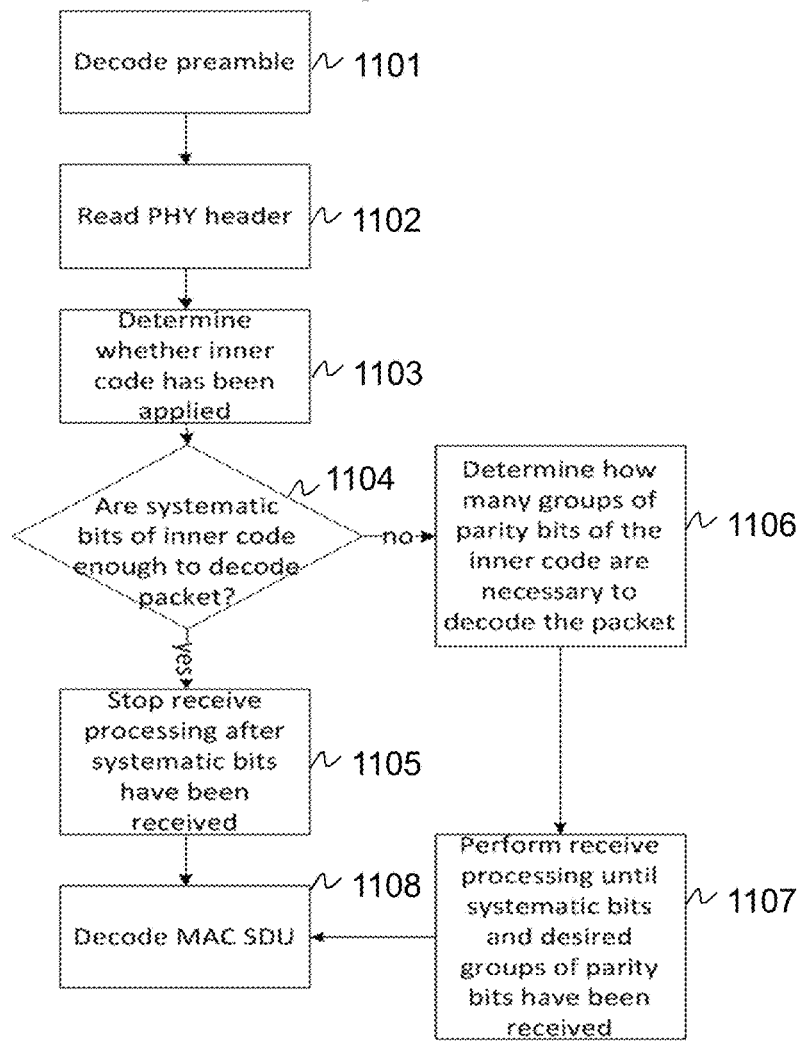
FIG. 11 is a flowchart schematically illustrating exemplary embodiments of a method performed by a receiving node.

FIG. 11 schematically illustrates a flowchart of some second exemplifying procedures performed by the receiving node 104. The exemplifying procedures comprise one or more of the following actions. It should be understood that these actions may be taken in any suitable order and that some actions may be combined.

Action 1101

The receiving node 104 decodes the packet preamble 402. This relates to Action 602 previously described.

Action 1102

The receiving node 104 reads the PHY header from the decoded packet preamble. This relates to Action 602 previously described.

Action 1103

The receiving node 104 discovers whether or not an inner channel encoder has been applied for range extension. This relates to Action 601 previously described.

Action 1104

The receiving node 104 determines whether or not the systematic bits of the inner channel encoder are enough to decode the packet. That is the receiving node 104 determines whether or not the bits comprised in the first set of OFDM symbols 404 are sufficient for decoding the packet. This relates to Action 603 previously described.

Action 1105

If the systematic bits of the inner channel encoder are sufficient to decode the packet then the receiving node 104 stops processing after the systematic bits have been received and no attempt is made to receive or demodulate the rest of the packet. This relates to Actions 604 and 606 previously described.

Action 1106

If the systematic bits of the inner channel encoder are not sufficient to decode the packet, the receiving node 104 determines how many groups of parity bits are required in order to decode the packet. Thus, the receiving node 104 determines how many of the one or more second sets of OFDM symbols 406 are needed for decoding the packet. This relates to Action 603 previously described.

Action 1107

The receiving node 104 performs receive processing until systematic bits and desired groups of parity bits have been received. The OFDM symbols corresponding to the desired groups of parity bits are received and demodulated.

Action 1108

The receiving node 104 decodes the OFDM symbols corresponding to the systematic bits and to the desired groups of parity bits. Thereafter, the receiving node 104 stops receiving further groups of parity bits. The receiving node 104 determines whether the inner channel encoder is necessary to successfully decode the packet, based, for example, on SNR estimates performed over the preamble, or by estimating the mutual information. This relates to Actions 605 and 606 previously described.

In some embodiments, the receiving node 104 buffers the received packet and attempts to decode the outer channel code. That is, it tries to decode without the help of the extra parity bits added by the inner channel encoder. This happens for example when the receiving node 104 estimates the SNR or channel capacity and determines that the outer channel code alone is enough to decode the payload. In some other embodiments, the receiving node 104 always tries to decode the outer code bits without using the parity bits provided by the inner channel encoder, and only uses the inner channel decoder when the attempt to decode the payload without the inner code fails.

If the decoding without the help of the extra parity bits is not successful, e.g. the CRC does not check, then the receiving node 104 includes the first block of parity bits of the inner channel encoder, e.g. a first second set of OFDM symbols 406-1, in the decoding process. If this decoding is not successful, e.g. the CRC does not check, then the receiving node 104 includes the second block of parity bits of the inner channel encoder, e.g. the second second set of OFDM symbols 406-2, in the decoding process. The process continues until the packet is successfully decoded or as long as there are any more blocks of parity bits. In this way, the receiving node 104 does not make a definitive decision of whether the inner channel encoder parity bits are needed. This type of procedure may be useful when for example the receiving node 104 does not need to acknowledge a successful reception of the packet 400, and therefore it is not too limited in the time available for decoding. This decoding procedure is exemplified in FIG. 12, which is a schematic combined exemplary packet and flowchart schematically illustrating a method performed by a receiving node.

Figure 12:
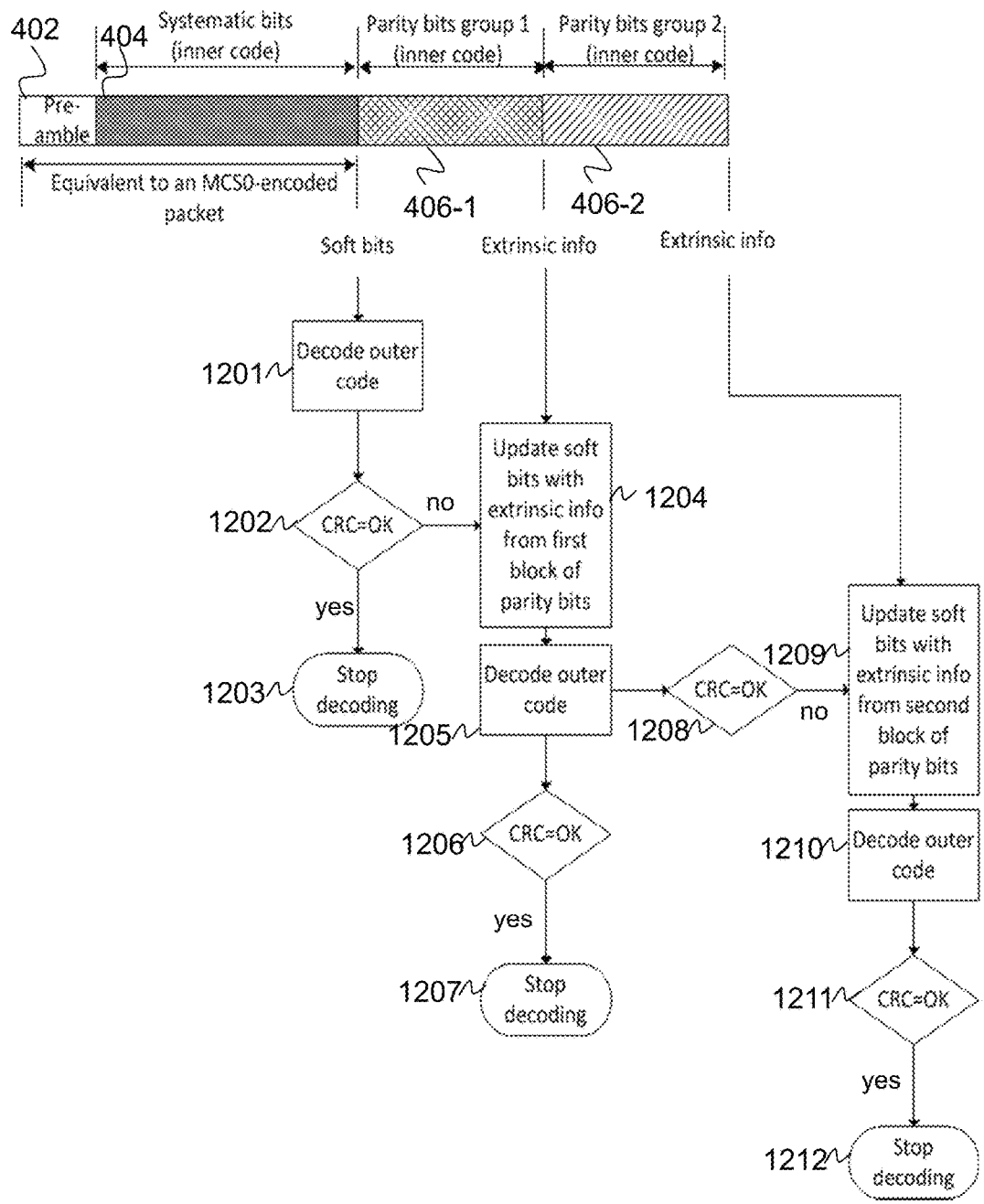
FIG. 12 is a schematic combined exemplary packet and flowchart schematically illustrating a method performed by a receiving node.

FIG. 12 schematically illustrates a flowchart of some third exemplifying procedures performed by the receiving node 104. The exemplifying procedures comprise one or more of the following actions. It should be understood that these actions may be taken in any suitable order and that some actions may be combined.

Action 1201

The receiving node 104 tries to decode payload data by applying the outer channel code or decoder to soft bits, e.g. to the first set of OFDM symbols 404. This relates to Action 603 previously described.

Action 1202

The receiving node 104 checks if the decoding is successful, e.g. the receiving node 104 checks whether or not the CRC checks.

Action 1203

When the decoding of the payload data was determined to be successful, the receiving node 104 stops decoding. This relates to Action 606 previously described.

Action 1204

When the decoding of the payload data was determined to be unsuccessful, the receiving node 104 updates soft bits with extrinsic information from the first block of parity bits, e.g. from the first second set of OFDM symbols 406-1. This relates to Action 605 previously described.

Action 1205

The receiving node 104 tries to decode payload data by applying the outer channel code or decoder to the updated soft bits, e.g. to the first set of OFDM symbols 404 and the first second set of OFDM symbols 406-1. This relates to Actions 605 previously described.

Action 1206

The receiving node 104 checks if the decoding is successful, e.g. the receiving node 104 checks whether or not the CRC checks.

Action 1207

When the decoding of the payload data from the updated soft bits was determined to be successful, the receiving node 104 stops decoding. This relates to Action 606 previously described.

Action 1208

When the decoding of the payload data was determined to be unsuccessful, Action 1209 is performed.

Action 1209

When the decoding of the payload data from the updated soft bits was determined to be unsuccessful, the receiving node 104 updates the updated soft bits with extrinsic information from the second block of parity bits, e.g. from the second second set of OFDM symbols 406-2. This relates to Action 605 previously described.

Action 1210

The receiving node 104 tries to decode payload data from the updated soft bits from Action 1209 by applying the outer channel code or decoder to the updated soft bits, e.g. to the first set of OFDM symbols 404, the first second set of OFDM symbols 406-1, and the second set of OFDM symbols 406-2. This relates to Actions 605 previously described.

Action 1211

The receiving node 104 checks if the decoding is successful, e.g. the receiving node 104 checks whether or not the CRC checks.

Action 1212

When the decoding of the payload data from the updated soft bits was determined to be successful, the receiving node 104 stops decoding. This relates to Action 606 previously described.

It should be understood that one or more of the actions described above may be repeated until the payload data has been successfully decoded or as long as there are any further second sets of OFDM symbols 406 available.

The channel coding and packet format described in this disclosure may also be used in e.g. unicasting in order to enhance link adaptation. For example, if the link adaptation algorithm at the transmitting node 102 determines wrongly that a range extension is needed, then the receiving node 104 may determine autonomously whether to process the entire packet or only one or more parts of the entire packet, and thus the receiving node 104 may save energy by not trying to decode the entire packet when it only needs to decode parts of the packet due to the MCS being more robust than actually necessary.

SOME EXAMPLES

Some First Examples

Figure 13:
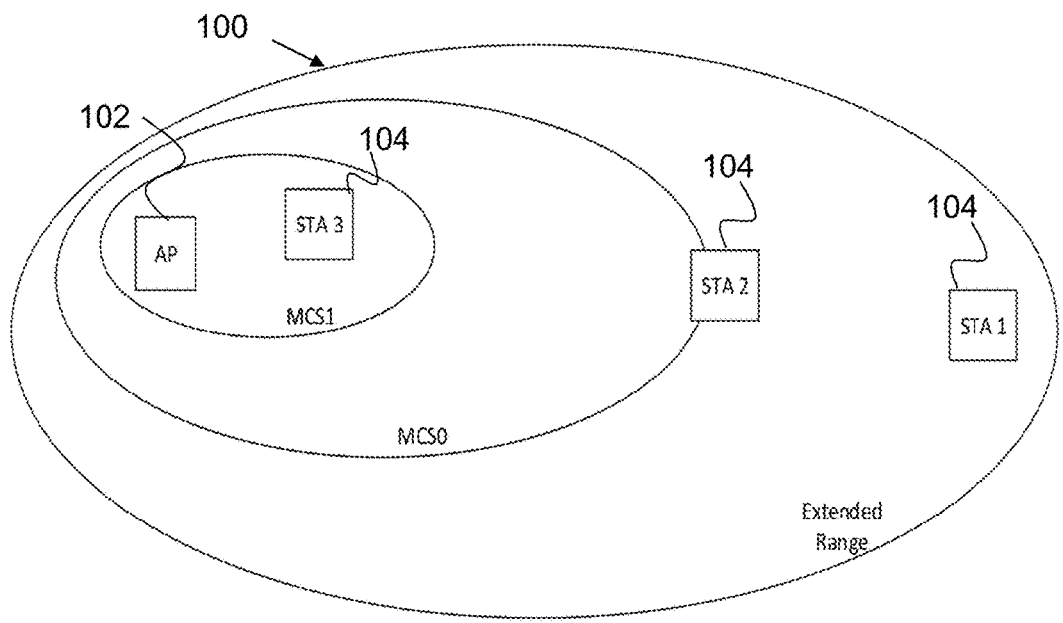
FIG. 13 is a schematic block diagram schematically illustrating embodiments of a communications network.

Some first examples provides an illustration of encoding, packet formatting, packet reception and packet decoding in the context of an IEEE 802.11ah BSS using a 1 MHz channel bandwidth. FIG. 13 is a schematic block diagram schematically illustrating embodiments of a communications network. Suppose that a BSS is as illustrated in FIG. 13, and that the transmitting node 102, e.g. an AP, is transmitting a beacon.

In this example, the outer channel encoder is identical to the IEEE 802.11ah MCS0 convolutional channel encoder, including interleaving and CRC. Further, the inner channel encoder is a rate 2/3 single parity check encoder with a systematic encoder and generator matrix $$G = \begin{bmatrix} 1 & 0 & 1 \\ 0 & 1 & 1 \end{bmatrix}.$$

Suppose that the output of the outer channel encoder, e.g. the plurality of outer code bits, consists of 120 bytes, e.g. 960 bits. This payload is divided into 480 groups of 2 bits, and each group is encoded using the generator matrix G. The output is 480 groups of 3 bits each, in total 1440 bits, consisting of the original 960 bits and 480 parity bits.

The 960 systematic bits are mapped to 40 OFDM symbols, wherein each OFDM symbol may carry 24 data bits. The 480 parity bits are mapped to 20 OFDM symbols. The packet is formatted such that the 40 OFDM symbols carrying systematic bits are transmitted before the 20 OFDM symbols carrying parity bits.

At the receiver side, e.g. at the receiving node 104, two scenarios may occur.

A first scenario is when the receiving node 104 is one of the receiving nodes indicated as STA1 or STA2 in FIG. 13. In such first scenario, the receiving node 104 detects the packet, e.g. the packet 400, decodes the PHY header contained in the preamble and determines that a rate 2/3 single parity check inner channel encoder has been applied to the data. The receiving node 104 performs a channel estimate over the Long Training Field (LTF) contained in the preamble and determines that the SNR is so low that both the inner channel encoder and the outer channel encoder must be used. All 60 OFDM symbols carrying the payload are received, equalized and demodulated. The output of the demodulator are reliability values, e.g. log-likelihood ratios, often called soft bits or soft values, corresponding to the 1440 inner code bits. The receiving node 104 forms 480 groups of 3 soft bits, corresponding to the groups of inner code bits. Let's call them $L_n(1), L_n(2), L_n(3), n=1, \ldots, 480$. Thus $L_n(k)$ is the k-th soft value in the n-th group. Using a propagation of belief algorithm, the soft values $L_n(1), L_n(2)$ corresponding to the systematic bits are updated as follows:

$\overline{L}_n(1) = L_n(1) + \text{sign}(L_n(2)) \cdot \text{sign}(L_n(3)) \cdot \min(|L_n(2)|, |L_n(3)|)$, $\overline{L}_n(2) = L_n(2) + \text{sign}(L_n(1)) \cdot \text{sign}(L_n(3)) \cdot \min(|L_n(1)|, |L_n(3)|)$.

As seen, the update operations have very low computational complexity. The updated soft values $\overline{L}_n(1), \overline{L}_n(2)$, $n=1, \ldots, 480$ are then fed to the outer channel decoder. This simple inner channel encoder may provide up to 2.5 dB additional gain at very low computational complexity.

A second scenario is when the receiving node 104 is the receiving node indicated as STA3 in FIG. 13. In such second scenario, the receiving node 104 detects the packet, decodes the PHY header contained in the preamble and determines that a rate 2/3 single parity check inner channel encoder has been applied to the data. It performs a channel estimate over the LTF contained in the preamble and determines that the SNR exceeds 20 dB. The receiving node 104 determines that the outer channel encoder is unnecessary. The 40 OFDM symbols carrying the inner systematic code bits are received, equalized and demodulated. The 960 soft values are fed to the outer channel decoder.

Some Second Examples

Some second examples provide an illustration of encoding, packet formatting, packet reception and packet decoding in the context of the IEEE 802.11ah BSS using a 1 MHz channel bandwidth. Suppose that the BSS is as illustrated in FIG. 13 and that the transmitting node 102 is transmitting a beacon.

In this example the outer channel encoder is identical to the IEEE 802.11ah MCS0 convolutional channel encoder, including interleaving and CRC. The inner channel encoder is a rate 1/2 single parity check encoder with a systematic encoder and generator matrix $$G = \begin{bmatrix} 1 & 0 & 1 & 1 \\ 0 & 1 & 1 & 1 \end{bmatrix}.$$

Suppose that the output of the outer encoder consists of 120 bytes, e.g. 960 bits. This payload is divided into 480 groups of 2 bits, and each group is encoded using the generator matrix G. The output is 480 groups of 4 bits each, in total 1920 bits, consisting of the original 960 bits and 960 parity bits. Note that the first and second parity bits are equal, so there is a natural way to group the parity bits in such a way that the second group of 480 parity bits is a copy of the first group of 480 parity bits. This simple code may provide a gain of up to 4.5 dB when using a propagation of belief algorithm to update the soft values of the systematic inner code bits. Thus, no iterations are required.

The 960 systematic bits are mapped to 40 OFDM symbols, wherein each OFDM symbol may carry 24 data bits. The first group of 480 parity bits is mapped to 20 OFDM symbols. The second group of 480 parity bits is mapped to 20 OFDM symbols. The packet is formatted such that the 40 OFDM symbols carrying systematic bits are transmitted before the two groups carrying parity bits, each consisting of 20 OFDM symbols. The formatted packet may be as the packet 400 illustrated in FIG. 10, wherein N is equal to two.

Figure 14:
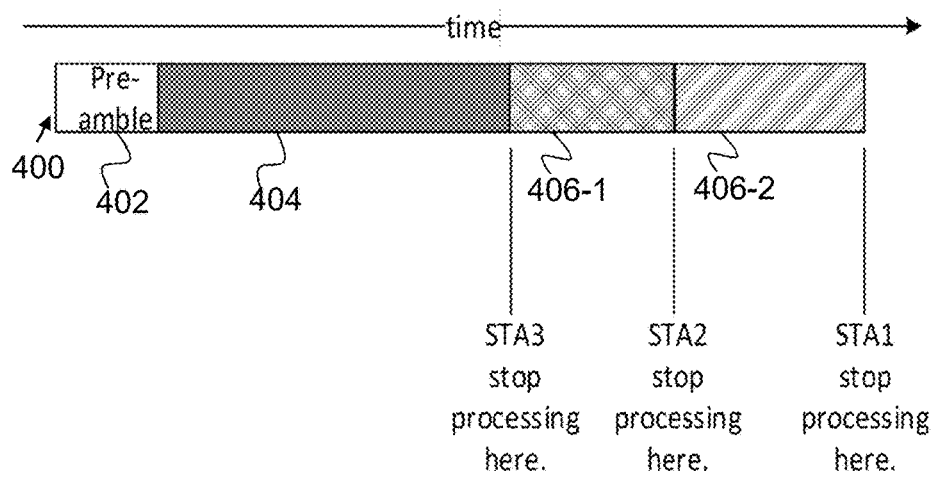
FIG. 14 is a schematic combined exemplary packet and flowchart schematically illustrating a method performed by a receiving node.

At the receiver side, the receiving node 104 demodulate the required parity bits according to its needs, as shown in FIG. 14. FIG. 14 is a schematic combined exemplary packet and flowchart schematically illustrating a method performed by a receiving node, e.g. the receiving node 104. For example and as illustrated FIG. 14, the receiving node 104 when being the STA3 located closest to the transmitting node 102, e.g. the AP, stops first and when being the STA1 farthest away from the transmitting node 102, stops last. Thus, when the receiving node 104 is located far away from the transmitting node 102 the receiving node 104 will need to receive more parts of the packet as compared when it is located close to the transmitting node 102.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appending claims.

The invention claimed is:

1. A method, performed by a transmitting node, for providing enhanced channel coding of a packet transmitted in a wireless communications network, wherein the transmitting node and a receiving node are operating in the wireless communications network, and wherein the method comprises:
applying, to payload data to be transmitted, an outer channel encoder resulting in a plurality of outer code bits;
applying an inner channel encoder to the plurality of outer code bits;
dividing resulting code bits of the inner channel encoder into a first group of bits comprising one or more bits of a first type and one or more second groups of bits comprising one or more bits of a second type;
generating a first set of Orthogonal Frequency-Division Multiplexing (OFDM) symbols carrying at least a part of the first group of bits, and one or more second sets of OFDM symbols carrying at least a part of the one or more second groups of bits; and
transmitting, to the receiving node, a packet comprising the first set of OFDM symbols followed by the one or more second sets of OFDM symbols, whereby an enhanced channel coding of the transmitted packet is provided.

2. The method of claim 1, wherein the applying of the inner channel encoder comprises:
applying one or more of: a single parity check encoder to the plurality of outer code bits; and a repetition encoder to the plurality of outer code bits.

3. The method of claim 1, wherein the first set of OFDM symbols comprises a number of code bits out of the plurality of outer code bits, and the second set of OFDM symbols comprises parity bits generated by the inner channel encoder.

4. The method of claim 1, further comprising:
transmitting, to the receiving node, one or more of an indication of the presence of the inner channel encoder and information relating to the inner channel encoder.

5. The method of claim 4, wherein the one or more of the indication and the information is included in a physical layer header of a preamble of the packet.

6. The method of claim 1, wherein the first set of OFDM symbols and the one or more second sets of OFDM symbols are included in the packet in a consecutive order such that the first set of OFDM symbols is transmitted before a first second set of OFDM symbols out of the one or more second sets of OFDM symbols.

7. The method of claim 1, wherein the outer channel encoder is one or more of: an error detection encoder, an error correction encoder and a legacy Modulation and Coding Scheme channel encoder.

8. A transmitting node for providing enhanced channel coding of a packet transmitted in a wireless communications network, wherein the transmitting node and a receiving node are configured to operate in the wireless communications network, and wherein the transmitting node comprises:
transmitter circuitry; and
processing circuitry configured to:
apply, to payload data to be transmitted via the transmitter circuitry, an outer channel encoder resulting in a plurality of outer code bits;
apply an inner channel encoder to the plurality of outer code bits;
divide resulting code bits of the inner channel encoder into a first group of bits comprising one or more bits of a first type and one or more second groups of bits comprising one or more bits of a second type;
generate a first set of Orthogonal Frequency-Division Multiplexing (OFDM) symbols carrying at least a part of the first group of bits, and one or more second sets of OFDM symbols carrying at least a part of the one or more second groups of bits; and
transmit, to the receiving node, a packet comprising the first set of OFDM symbols followed by the one or more second sets of OFDM symbols, whereby an enhanced channel coding of the transmitted packet is provided.

9. The transmitting node of claim 8, wherein the processing circuitry is configured to apply the inner channel encoder by applying one or more of: a single parity check encoder to the plurality of outer code bits and a repetition encoder to the plurality of outer code bits.

10. The transmitting node of claim 8, wherein the first set of OFDM symbols comprises a number of code bits out of the plurality of outer code bits, and the second set of OFDM symbols comprises parity bits generated by the inner channel encoder.

11. The transmitting node of claim 8, wherein the processing circuitry is configured to:
transmit, to the receiving node, one or more of an indication of the presence of the inner channel encoder and information relating to the inner channel encoder.

12. The transmitting node of claim 11, wherein the one or more of the indication and the information is included in a physical layer header of a preamble of the packet.

13. The transmitting node of claim 8, wherein the first set of OFDM symbols and the one or more second sets of OFDM symbols are included in the packet in a consecutive order such that the first set of OFDM symbols is transmitted before a first second set of OFDM symbols out of the one or more second sets of OFDM symbols.

14. The transmitting node of claim 8, wherein the outer channel encoder is one or more of: an error detection encoder, an error correction encoder and a legacy Modulation and Coding Scheme channel encoder.

15. A method, performed by a receiving node, for enabling enhanced channel coding of a packet transmitted in a wireless communications network, wherein a transmitting node and the receiving node are operating in the wireless communications network, and wherein the method comprises:
receiving, from the transmitting node, parts of a packet, which packet comprises a first set of Orthogonal Frequency-Division Multiplexing (OFDM) symbols followed by one or more second sets of OFDM symbols, wherein the first set of OFDM symbols carries at least a part of a first group of bits comprising bits of a first type, and wherein the one or more second sets of OFDM symbols carry at least a part of one or more second groups of bits comprising bits of a second type;
when payload data is decodable from received parts comprising the first set of OFDM symbols, decoding the payload data from the first set of OFDM symbols;
when payload data is unsuccessfully decoded from received parts comprising the first set of OFDM symbols, decoding the payload data from the first set of OFDM symbols and the one or more second sets of OFDM symbols; and
stopping receiving parts of the packet when the payload data is decoded.

16. The method of claim 15, further comprising:
determining whether the payload data is successfully decodable from received parts comprising the first set of OFDM symbols, based on an estimation of a channel quality.

17. The method of claim 15, wherein the decoding of the payload data from the first set of OFDM symbols comprises:
applying, to the first set of OFDM symbols, an outer channel decoder resulting in decoded payload data.

18. The method of claim 17, wherein the outer channel decoder is one or more of: a convolution decoder, a Low Density Parity Check Code decoder and a Cyclic Redundancy Check Code.

19. The method of claim 15, wherein the decoding of the payload data from the first set of OFDM symbols and the one or more second sets of OFDM symbols comprises:
applying, to the first set of OFDM symbols, an outer channel decoder resulting in unsuccessful decoding;
applying, to a first one of the one or more second sets of OFDM symbols, an inner decoder resulting in a plurality of outer code bits; and
applying, to the plurality of outer code bits, the outer channel decoder resulting in decoded payload data.

20. The method of claim 15, further comprising:
receiving, from the transmitting node, one or more of an indication of the presence of the inner channel encoder and information relating to the inner channel encoder.

21. The method of claim 20, wherein the one or more of the indication and the information is included in a physical layer header of a preamble of the packet.

22. The method of claim 15, wherein the first set of OFDM symbols and the one or more second sets of OFDM symbols are included in the packet in a consecutive order such that the first set of OFDM symbols is received before a first second set of OFDM symbols out of the one or more second sets of OFDM symbols.

23. A receiving node for enabling enhanced channel coding of a packet transmitted in a wireless communications network, wherein a transmitting node and the receiving node are configured to operate in the wireless communications network, and wherein the receiving node comprises:
receiver circuitry; and
processing circuitry configured to:
receive, via said receiver circuitry, parts of a packet transmitted from the transmitting node, which packet comprises a first set of Orthogonal Frequency-Division Multiplexing (OFDM) symbols followed by one or more second sets of OFDM symbols, wherein the first set of OFDM symbols carries at least a part of a first group of bits comprising bits of a first type, and wherein the one or more second sets of OFDM symbols carry at least a part of one or more second groups of bits comprising bits of a second type;
when payload data is decodable from received parts comprising the first set of OFDM symbols, decode the payload data from the first set of OFDM symbols;
when payload data is unsuccessfully decoded from received parts comprising the first set of OFDM symbols, decode the payload data from the first set of OFDM symbols and the one or more second sets of OFDM symbols; and
stop receiving parts of the packet when the payload data is decoded.

24. The receiving node of claim 23, wherein the processing circuitry is configured to:
determine whether the payload data is successfully decodable from received parts comprising the first set of OFDM symbols, based on an estimation of a channel quality.

25. The receiving node of claim 23, wherein the processing circuitry is configured to decode the payload data from the first set of OFDM symbols by applying, to the first set of OFDM symbols, an outer channel decoder resulting in decoded payload data.

26. The receiving node of claim 25, wherein the outer channel decoder is one or more of: a convolution decoder, a Low Density Parity Check Code decoder and a Cyclic Redundancy Check Code decoder.

27. The receiving node of claim 23, wherein the processing circuitry is configured to decode the payload data from the first set of OFDM symbols and the one or more second sets of OFDM symbols by:
  applying, to the first set of OFDM symbols, an outer channel decoder resulting in unsuccessful decoding;
  applying, to a first one of the one or more second sets of OFDM symbols, an inner decoder resulting in a plurality of outer code bits; and
  applying, to the plurality of outer code bits the outer channel decoder resulting in decoded payload data.

28. The receiving node of claim 23, wherein the processing circuitry is configured to:
  receive, from the transmitting node, one or more of an indication of a presence of an inner channel encoder and information relating to the inner channel encoder.

29. The receiving node of claim 28, wherein the one or more of the indication and the information is included in a physical layer header of a preamble of the packet.

30. The receiving node of claim 23, wherein the first set of OFDM symbols and the one or more second sets of OFDM symbols are included in the packet in a consecutive order such that the first set of OFDM symbols is received before a first second set of OFDM symbols out of the one or more second sets of OFDM symbols.

31. A non-transitory computer readable storage medium storing a computer program for providing enhanced channel coding of a packet transmitted in a wireless communications network, the computer program comprising instructions that, when executed on at least one processor of a transmitting node, cause the transmitting node to:
  apply, to payload data to be transmitted, an outer channel encoder resulting in a plurality of outer code bits;
  apply an inner channel encoder to the plurality of outer code bits;
  divide resulting code bits of the inner channel encoder into a first group of bits comprising one or more bits of a first type and one or more second groups of bits comprising one or more bits of a second type;
  generate a first set of Orthogonal Frequency-Division Multiplexing (OFDM) symbols carrying at least a part of the first group of bits, and one or more second sets of OFDM symbols carrying at least a part of the one or more second groups of bits; and
  transmit, to a receiving node, a packet comprising the first set of OFDM symbols followed by the one or more second sets of OFDM symbols, whereby an enhanced channel coding of the transmitted packet is provided.

32. A non-transitory computer readable storage medium storing a computer program for enabling enhanced channel coding of a packet transmitted in a wireless communications network, the computer program comprising instructions that, when executed on at least one processor of a receiving node, cause the receiving node to:
  receive, from a transmitting node, parts of a packet, which packet comprises a first set of Orthogonal Frequency-Division Multiplexing (OFDM) symbols followed by one or more second sets of OFDM symbols, wherein the first set of OFDM symbols carries at least a part of a first group of bits comprising bits of a first type, and wherein the one or more second sets of OFDM symbols carry at least a part of one or more second groups of bits comprising bits of a second type;
  when payload data is decodable from received parts comprising the first set of OFDM symbols, decode the payload data from the first set of OFDM symbols;
  when payload data is unsuccessfully decoded from received parts comprising the first set of OFDM symbols, decode the payload data from the first set of OFDM symbols and the one or more second sets of OFDM symbols; and
  stop receiving parts of the packet when the payload data is decoded.

* * * * *